US012670645B2

(12) United States Patent
Zhong et al.

(10) Patent No.: US 12,670,645 B2
(45) Date of Patent: Jun. 30, 2026

(54) METHODS, APPARATUSES, SYSTEMS, AND COMPUTER-READABLE MEDIUMS FOR BIOMARKER QUANTIFICATION USING FREE-BREATHING STACK-OF-RADIAL IMAGING

(71) Applicant: Siemens Healthineers AG, Forchheim (DE)

(72) Inventors: Xiaodong Zhong, Oak Park, CA (US); Marcel Dominik Nickel, Herzogenaurach (DE); Stephan Kannengiesser, Wuppertal (DE); Vibhas S. Deshpande, Austin, TX (US)

(73) Assignee: Siemens Healthineers AG, Forchheim (DE)

( * ) Notice: Subject to any disclaimer, the term of this patent is extended or adjusted under 35 U.S.C. 154(b) by 374 days.

(21) Appl. No.: 18/464,454

(22) Filed: Sep. 11, 2023

(65) Prior Publication Data

US 2024/0331225 A1 Oct. 3, 2024

Related U.S. Application Data

(60) Provisional application No. 63/493,871, filed on Apr. 3, 2023.

(51) Int. Cl.
    *G06T 12/20* (2026.01)
    *G01R 33/567* (2006.01)

(52) U.S. Cl.
    CPC ............ *G06T 12/20* (2026.01); *G01R 33/567* (2013.01); *G06T 2210/41* (2013.01)

(58) Field of Classification Search
    USPC .................................................. 382/128, 131
    See application file for complete search history.

(56) References Cited

U.S. PATENT DOCUMENTS

| | | | | |
|---|---|---|---|---|
| 11,175,366 | B2 | 11/2021 | Zhong et al. | |
| 11,333,734 | B2 * | 5/2022 | Zhong | G01R 33/5673 |
| 2016/0324500 | A1 * | 11/2016 | Fan | G01R 33/5676 |
| 2017/0328970 | A1 * | 11/2017 | Bi | A61B 5/055 |
| 2021/0349166 | A1 * | 11/2021 | Zhong | G01R 33/56509 |
| 2024/0230810 | A1 * | 7/2024 | Shih | G01R 33/50 |
| 2025/0264560 | A1 * | 8/2025 | Beck | G01R 33/4824 |

OTHER PUBLICATIONS

Bilal et al., Reduction of Motion Artifacts in the Recovery of Undersampled DCE MR Images using Data Binning and L + S Decomposition, Hindawi BioMed Research International vol. 2019, ID 6139785, http://doi.org/10.1155/2019/6139785, pp. 1-11 (Year: 2019).*

(Continued)

*Primary Examiner* — Ishrat I Sherali

(57) ABSTRACT

A method of generating at least one image using a magnetic resonance imaging (MRI) system includes generating, for each contrast of a plurality of contrasts, an image by forming a multi-dimensional data matrix by dividing MRI imaging data for a contrast into a plurality of bins and generating the image based on at least the MRI imaging data and the multi-dimensional data matrix. Each bin of the plurality of bins corresponds to one of a plurality of respiratory motion states.

18 Claims, 15 Drawing Sheets

(56)                    References Cited

OTHER PUBLICATIONS

Schneider et al,. Free-breathing fat and R2 quantification in liver using a stack-of -star multi-echo acquisition with respiratory model-based reconstruction, Magnetic Resonance in Medicine, DOI.org /10..1002/mrm.28280, pp. 2592-2605. (Year: 2020).*

Lee, Chang Hee, et al. "Hepatic tumor response evaluation by MRI." NMR in Biomedicine 24.6 (2011): 721-733.

Guo, Yang, et al. "Imaging tumor response following liver-directed intra-arterial therapy." Abdominal imaging 38 (2013): 1286-1299.

Yokoo, Takeshi, et al. "Nonalcoholic fatty liver disease: diagnostic and fat-grading accuracy of low-flip-angle multiecho gradient-recalled-echo MR imaging at 1.5 T." Radiology 251.1 (2009): 67-76.

Dixon, W. Thomas. "Simple proton spectroscopic imaging." Radiology 153.1 (1984): 189-194.

Glover, Gary H., and Erika Schneider. "Three-point Dixon technique for true water/fat decomposition with BO inhomogeneity correction." Magnetic resonance in medicine 18.2 (1991): 371-383.

Ma, Jingfei. "Dixon techniques for water and fat imaging." Journal of Magnetic Resonance Imaging: An Official Journal of the International Society for Magnetic Resonance in Medicine 28.3 (2008): 543-558.

Reeder, Scott B., et al. "Quantitative assessment of liver fat with magnetic resonance imaging and spectroscopy." Journal of magnetic resonance imaging 34.4 (2011): 729-749.

Hussain, Hero K., et al. "Hepatic fat fraction: MR imaging for quantitative measurement and display-early experience." Radiology 237.3 (2005): 1048-1055.

O'Regan, Declan P., et al. "Liver fat content and T2*: simultaneous measurement by using breath-hold multiecho MR imaging at 3.0 T—feasibility." Radiology 247.2 (2008): 550-557.

Guiu, Boris, et al. "Quantification of liver fat content: comparison of triple-echo chemical shift gradient-echo imaging and in vivo proton MR spectroscopy." Radiology 250.1 (2009): 95-102.

Yokoo, Takeshi, et al. "Estimation of hepatic proton-density fat fraction by using MR imaging at 3.0 T." Radiology 258.3 (2011): 749-759.

Koken, P., H. Eggers, and P. Börnert. "Fast single breath-hold 3D abdominal imaging with water-fat separation." Proc Intl Soc Magn Reson Med. vol. 15. 2007.

Yu, Huanzhou, et al. "Multiecho water-fat separation and simultaneous R estimation with multifrequency fat spectrum modeling." Magnetic Resonance in Medicine: An Official Journal of the International Society for Magnetic Resonance in Medicine 60.5 (2008): 1122-1134.

Zhong, Xiaodong, et al. "Liver fat quantification using a multi-step adaptive fitting approach with multi-echo GRE imaging." Magnetic resonance in medicine 72.5 (2014): 1353-1365.

Wood, John C., et al. "MRI R2 and R2* mapping accurately estimates hepatic iron concentration in transfusion-dependent thalassemia and sickle cell disease patients." Blood 106.4 (2005): 1460-1465.

Hankins, Jane S., et al. "R2* magnetic resonance imaging of the liver in patients with iron overload." Blood, The Journal of the American Society of Hematology 113.20 (2009): 4853-4855.

Hernando, Diego, et al. "Quantification of liver iron with MRI: state of the art and remaining challenges." Journal of Magnetic Resonance Imaging 40.5 (2014): 1003-1021.

Hernando, Diego, J. Harald Kramer, and Scott B. Reeder. "Multipeak fat-corrected complex R2* relaxometry: theory, optimization, and clinical validation." Magnetic resonance in medicine 70.5 (2013): 1319-1331.

Armstrong, Tess, et al. "Free-breathing liver fat quantification using a multiecho 3 D stack-of-radial technique." Magnetic resonance in medicine 79.1 (2018): 370-382.

Armstrong, Tess, et al. "Free-breathing quantification of hepatic fat in healthy children and children with nonalcoholic fatty liver disease using a multi-echo 3-D stack-of-radial MRI technique." Pediatric radiology 48 (2018): 941-953.

Zhong, Xiaodong, et al. "Effect of respiratory motion on free-breathing 3D stack-of-radial liver relaxometry and improved quantification accuracy using self-gating." Magnetic resonance in medicine 83.6 (2020): 1964-1978.

Zhong, Xiaodong, et al. "Free-Breathing Volumetric Liver and Proton Density Fat Fraction Quantification in Pediatric Patients Using Stack-of-Radial MRI With Self-Gating Motion Compensation." Journal of Magnetic Resonance Imaging 53.1 (2021): 118-129.

Armstrong, Tess, et al. "Free-breathing 3D stack-of-radial MRI quantification of liver fat and R2* in adults with fatty liver disease." Magnetic Resonance Imaging 85 (2022): 141-152.

Lustig, Michael, David Donoho, and John M. Pauly. "Sparse MRI: The application of compressed sensing for rapid MR imaging." Magnetic Resonance in Medicine: An Official Journal of the International Society for Magnetic Resonance in Medicine 58.6 (2007): 1182-1195.

Lustig, Michael, et al. "Compressed sensing MRI" IEEE signal processing magazine 25.2 (2008): 72-82.

Chan, Rachel W., et al. "The influence of radial undersampling schemes on compressed sensing reconstruction in breast MRI." Magnetic resonance in medicine 67.2 (2012): 363-377.

Feng, Li, et al. "Golden-angle radial sparse parallel MRI: combination of compressed sensing, parallel imaging, and golden-angle radial sampling for fast and flexible dynamic volumetric MRI." Magnetic resonance in medicine 72.3 (2014): 707-717.

Kim, Sungheon G., et al. "Influence of temporal regularization and radial undersampling factor on compressed sensing reconstruction in dynamic contrast enhanced MRI of the breast." Journal of Magnetic Resonance Imaging 43.1 (2016): 261-269.

Park, Charlie C., et al. "Assessment of a high-SNR chemical-shift-encoded MRI with complex reconstruction for proton density fat fraction (PDFF) estimation overall and in the low-fat range." Journal of Magnetic Resonance Imaging 49.1 (2019): 229-238.

Grimm, R., et al. "Self-gating reconstructions of motion and perfusion for free-breathing T1-weighted DCEMRI of the thorax using 3D stack-of-stars GRE imaging." Proceedings of the 20th scientific meeting, International Society for Magnetic Resonance in Medicine. 2012.

Grimm, Robert, et al. "Optimal channel selection for respiratory self-gating signals." Proc. 21st Annual Meeting ISMRM, Salt Lake City, Utah, USA. vol. 3749. 2013.

Bi, Xiaoming, et al. "Respiratory phase-resolved 3D body imaging using iterative motion correction and average." U.S. Pat. No. 10,605,880. Mar. 31, 2020.

Feng, Li, et al. "XD-GRASP: golden-angle radial MRI with reconstruction of extra motion-state dimensions using compressed sensing." Magnetic resonance in medicine 75.2 (2016): 775-788.

Feng, Li, et al. "Magnetization-prepared Grasp MRI for rapid 3D T1 mapping and fat/water-separated T1 mapping." Magnetic resonance in medicine 86.1 (2021): 97-114.

Kaltenbach, Benjamin, et al. "Dynamic liver magnetic resonance imaging in free-breathing: feasibility of a Cartesian T1-weighted acquisition technique with compressed sensing and additional self-navigation signal for hard-gated and motion-resolved reconstruction." Investigative radiology 52.11 (2017): 708-714.

Block, Kai Tobias, et al. "Towards routine clinical use of radial stack-of-stars 3D gradient-echo sequences for reducing motion sensitivity." Journal of the Korean Society of Magnetic Resonance in Medicine 18.2 (2014): 87-106.

Fujinaga, Yasunari, et al. "Advantages of radial volumetric breath-hold examination (VIBE) with k-space weighted image contrast reconstruction (KWIC) over Cartesian VIBE in liver imaging of volunteers simulating inadequate or No. breath-holding ability." European radiology 26 (2016): 2790-2797.

Zhong, Xiaodong, et al. "Accelerated k-space shift calibration for free-breathing stack-of-radial MRI quantification of liver fat and." Magnetic Resonance in Medicine 87.1 (2022): 281-291.

(56) References Cited

OTHER PUBLICATIONS

GitHub—pehses/twixtools: "python file reader/writer for Siemens MRI raw data + compression utility"; https://github.com/pehses/twixtools. Published Jul. 23, 2020. Updated Nov. 15, 2022. Accessed Dec. 12, 2022. 7 pages.

Length RV. emmeans: Estimated Marginal Means, aka Least-Squares Means. R package version 1.7.4-1. https://CRAN.R-project.org/package=emmeans. Published May 16, 2022. Updated Oct. 20, 2022. Accessed Mar. 12, 2023. 2 pages.

Wang, Bo, Aaron M. Goodpaster, and Michael A. Kennedy. "Coefficient of variation, signal-to-noise ratio, and effects of normalization in validation of biomarkers from NMR-based metabonomics studies." Chemometrics and Intelligent Laboratory Systems 128 (2013): 9-16.

Pruessmann, Klaas P., et al. "Advances in sensitivity encoding with arbitrary k-space trajectories." Magnetic Resonance in Medicine: An Official Journal of the International Society for Magnetic Resonance in Medicine 46.4 (2001): 638-651.

* cited by examiner

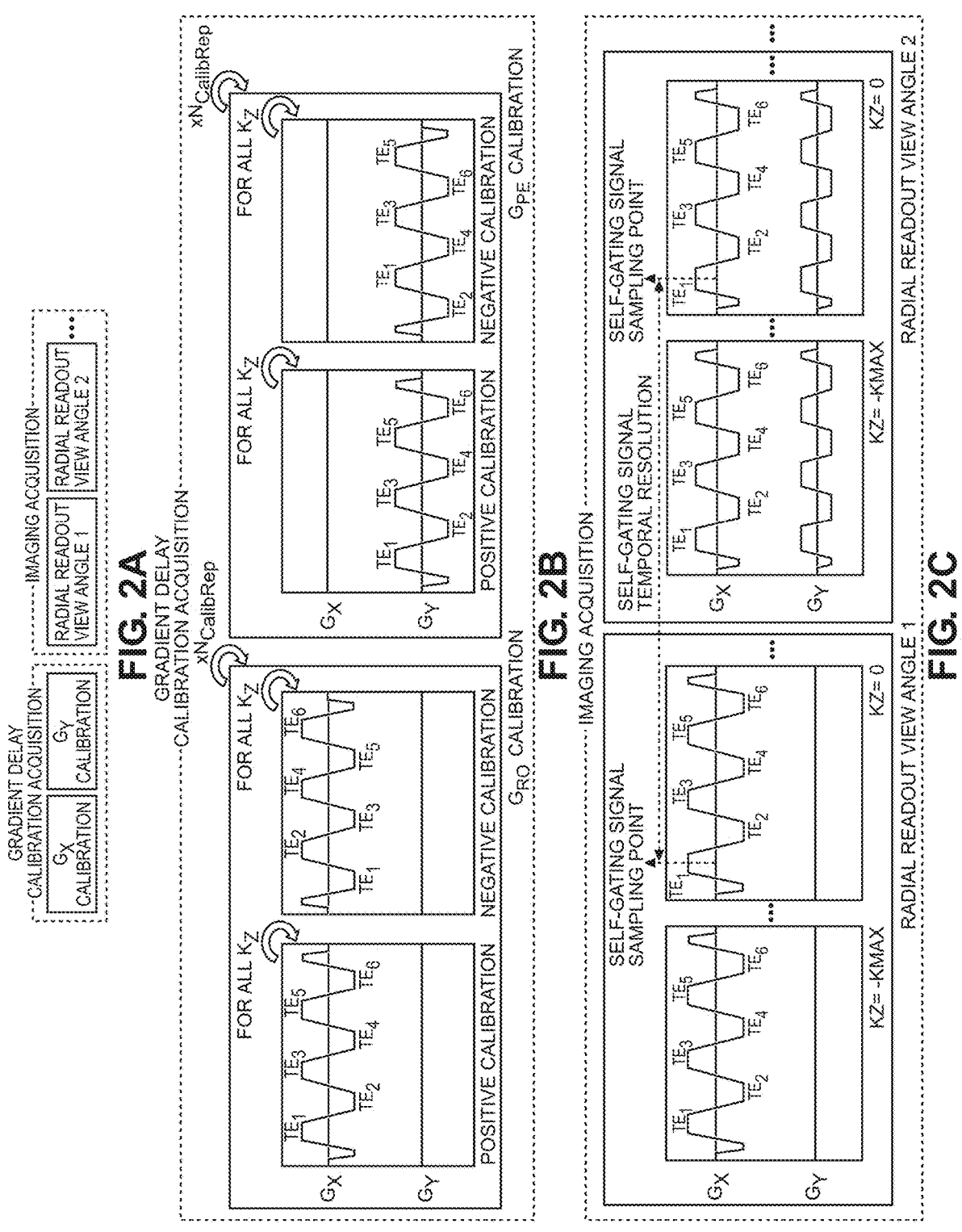

| IMAGING PARAMETERS | PHANTOM | IN VIVO | |
| --- | --- | --- | --- |
| | STACK-OF-RADIAL | BREATH-HOLD CARTESIAN | FREE-BREATHING STACK OF-RADIAL |
| FIELD STRENGTH (T) | 3 | 3 | 3 |
| TR (ms) | 11 | 8.85 | 8.85 |
| TE (ms) | 1.43, 2.75, 4.07, 5.39, 6.71, 8.03 | 1.23, 2.46, 3.69, 4.92, 6.15, 7.38 | 1.23, 2.46, 3.69, 4.92, 6.15, 7.38 |
| FOV ($mm^2$) | 408 x 408 | 410 x 410 | 410 x 410 or 360 x 360 |
| IMAGE MATRIX | 320 x 320 | 256 x 256 | 256 x 256 or 224 x 224 |
| IN-PLANE PIXEL SIZE ($mm^2$) | 1.28 x 1.28 | 1.6 x 1.6 | 1.6 x 1.6 |
| THROUGH-PLANE PIXEL SIZE (mm) | 5 | 5 | 5 |
| SLICE NUMBER | 24 | 30 | 36 |
| FLIP ANGLE (DEGREE) | 5 | 5 | 5 |
| GRADIENT READOUT MODE | Bipolar | Bipolar | Bipolar |
| IMAGING ORIENTATION | Axial | Axial | Axial |
| SLICE RESOLUTION (%) | 100 | 100 | 100 |
| SLICE OVERSAMPLING (%) | 0 | 20 | 11.1 |
| PARALLEL IMAGING ACCELERATION FACTOR | N/A | CAIPRIRINHA 2x2 | N/A |
| RADIAL K-SPACE SHIFT CALIBRATION SCAN TIME (MIN:S) | 0:21 | N/A | 0.28 |
| ORIGINALLY ACQUIRED RADIAL VIEWS PER SLICE (EQUIVALENT SAMPLING FACTOR) | 768(1.5) | N/A | 404 or 352(1.0) |
| ORIGINAL TOTAL ACQUISITION TIME (MIN:S) | 3:44 | 0:22 | 2:51 or 2:33 |
| BASELINE: EQUIVALENT TOTAL ACQUISITION TIME FOR SAMPLING FACTOR = 1.0 (MIN:S) | 2:36 | N/A | 2:51 or 2:36 |
| EQUIVALENT TOTAL ACQUISITION TIME FOR SAMPLING FACTOR = 0.5 (MIN:S) (EQUIVALENT PERCENTAGE OF TIME SAVING COMPARED TO BASELINE) | 1:29 (42.9%) | N/A | 1:39 (42.1%) or 1:30 (41.1%) |
| PROPOSED: EQUIVALENT TOTAL ACQUISITION TIME FOR SAMPLING FACTOR = 0.25 (MIN:S) (EQUIVALENT PERCENTAGE OF TIME SAVING COMPARED TO BASELINE) | 0:55 (64.7%) | N/A | 1:04 (62.8%) or 0:59 (61.4%) |
| EQUIVALENT TOTAL ACQUISITION TIME FOR SAMPLING FACTOR = 0.125 (MIN:S) (EQUIVALENT PERCENTAGE OF TIME SAVING COMPARED TO BASELINE) | 0:38 (75.6%) | N/A | 0:46 (73.1%) or 0:44 (71.2%) |

METHODS, APPARATUSES, SYSTEMS, AND COMPUTER-READABLE MEDIUMS FOR BIOMARKER QUANTIFICATION USING FREE-BREATHING STACK-OF-RADIAL IMAGING

CROSS REFERENCE TO RELATED APPLICATIONS

This application claims benefit to provisional application Ser. No. 63/493,871 filed on Apr. 3, 2023, the contents of which are incorporated by reference.

TECHNICAL FIELD

Example embodiments relate to biomarker quantification using free-breathing stack-of-radial imaging.

BACKGROUND

Measurements and evaluation of tissue biomarkers using magnetic resonance imaging (MRI) is of growing clinical interest. The values of biomarkers typically change due to the tissue property changes caused by diseases, and they have the potential of sensitively reflecting early disease stages compared to qualitative diagnosis of regular magnetic resonance (MR) images. In addition, recording and comparing biomarker values may be especially valuable for treatment monitoring.

SUMMARY

In at least one example embodiment, a method of generating at least one image using a magnetic resonance imaging (MRI) system is described. The method may include generating, for each contrast of a plurality of contrasts, an image by forming a multi-dimensional data matrix by dividing MRI imaging data for a contrast into a plurality of bins, each bin of the plurality of bins corresponding to one of a plurality of respiratory motion states and generating the image based on at least the MRI imaging data and the multi-dimensional data matrix.

At least one other example embodiment provides a device for performing the method of generating at least one image using a magnetic resonance imaging (MRI) system.

At least one other example embodiment provides a means for generating at least one image using a magnetic resonance imaging (MRI) system. Generating the at least one image may include generating, for each contrast of a plurality of contrasts, an image by forming a multi-dimensional data matrix by dividing MRI imaging data for a contrast into a plurality of bins, each bin of the plurality of bins corresponding to one of a plurality of respiratory motion states and generating the image based on at least the MRI imaging data and the multi-dimensional data matrix.

At least one other example embodiment provides a system for generating at least one image. The system includes a processor and a memory including instructions that, when executed by the at least one processor, may cause the system to generate, for each contrast of a plurality of contrasts, an image by forming a multi-dimensional data matrix by dividing MRI imaging data for a contrast into a plurality of bins, each bin of the plurality of bins corresponding to one of a plurality of respiratory motion states and generating the image based on at least the MRI imaging data and the multi-dimensional data matrix.

At least one other example embodiment provides a non-transitory computer readable medium storing computer readable instructions that, when executed by one or more processors of a system, cause the system to perform a method of generating biomarker parameters. The method may include generating, for each contrast of a plurality of contrasts, an image by forming a multi-dimensional data matrix by dividing MRI imaging data for a contrast into a plurality of bins, each bin of the plurality of bins corresponding to one of a plurality of respiratory motion states and generating the image based on at least the MRI imaging data and the multi-dimensional data matrix.

In at least one example embodiment, the method may include generating a transformation matrix for each contrast of the plurality of contrasts. The generating may generate an image based on the MRI imaging data, the multi-dimensional data matrix and the transformation matrix. In at least one example embodiment, the transformation matrix may include at least one of an undersampling pattern, a coil sensitivity map, or a non-uniform Fourier transform. In at least one example embodiment, the method may include determining an image regularization involving a linear transformation for each contrast of the plurality of contrasts. The generating may generate an image based on the MRI imaging data, the multi-dimensional data matrix, the transformation matrix, and the image regularization. In at least one example embodiment, the image regularization may include at least one regularization factor. In at least one example embodiment, the at least one image regularization factor may include at least one of a regularization factor for spatial regularization or motion-state regularization. In at least one example embodiment, the method may include, for each contrast of the plurality of contrasts, applying the transformation matrix to the multi-dimensional data matrix for the contrast to obtain a transformed multi-dimensional data matrix. The generating may generate the image based on the MRI imaging data and the transformed multi-dimensional data matrix.

In at least one example embodiment, the generating may generate the image based on the MRI imaging data, the multi-dimensional data matrix, a transformation matrix, and an image regularization. In at least one example embodiment, the generating the image may include evaluating an optimization function based on the MRI imaging data, the multi-dimensional data matrix, the transformation matrix, and the image regularization. In at least one example embodiment, the optimization function may be based on an optimization equation given by $$\frac{1}{2}\|Ax - y\|_2^2 + \|W(\alpha, \beta)x\|_1$$

where A may be the transformation matrix, x may be a multi-dimensional data matrix of the imaging data to be reconstructed, y may be the multi-dimensional data matrix of acquired k-space data assigned to k-space and motion state dimensions, and W may be the image regularization. The multi-dimensional data matrix may include at least a spatial dimension and a motion-state dimension.

In at least one example embodiment, the method may include acquiring the MRI imaging data from an MRI system. The MRI imaging data may be acquired for each contrast of the plurality of contrasts resulting from application of a pulse of the MRI system. In at least one example embodiment, the method may include extracting a self-gating signal from the MRI imaging data and determining, based on the self-gating signal, the plurality of respiratory motion states associated with acquisition of the MRI imaging data. A separate self-gating signal may be extracted for each contrast included in the plurality of contrasts. In at least one example embodiment, the MRI imaging data may be acquired using a stack-of star trajectory and a self-gating signal may be extracted from the MRI imaging data by sampling a plurality of radial views included in the MRI imaging data. In at least one example embodiment, the method may include determining the plurality of motion states associated with acquisition of the MRI imaging data by measuring one or more physiological signals with the MRI system.

In at least one example embodiment, the method may include calculating one or more biomarker parameter maps based on the images generated for the plurality of contrasts. In at least one example embodiment, the one or more biomarker parameter maps may include at least one of a proton density fat fraction (PDFF) parameter map or a transverse relaxation rate ($R_2^*$) parameter map.

BRIEF DESCRIPTION OF THE DRAWINGS

Other objects and features of the present invention will become apparent from the following detailed description considered in conjunction with the accompanying drawings.

The drawings, however, are only examples and schematic solely for the purpose of illustration and do not limit the present invention. In the drawings:

FIG. 2A is a block diagram of a motion-compensated free-breathing stack-of-radial MRI pulse sequence according to an example embodiment.

FIG. 2B is an imaging diagram of a gradient delay calibration acquisition module according to an example embodiment.

FIG. 2C is an imaging diagram of an imaging acquisition module according to an example embodiment.

FIG. 6 is a table of imaging parameters used for phantom and in vivo data collection and processing to demonstrate the methods of FIG. 4 according to an example embodiment.

FIG. 9 shows example self-gating curves from a subject obtained by free-breathing radial acquisitions with 404 radial views and different temporal resolutions according to an example embodiment.

DETAILED DESCRIPTION

Figure 1A:
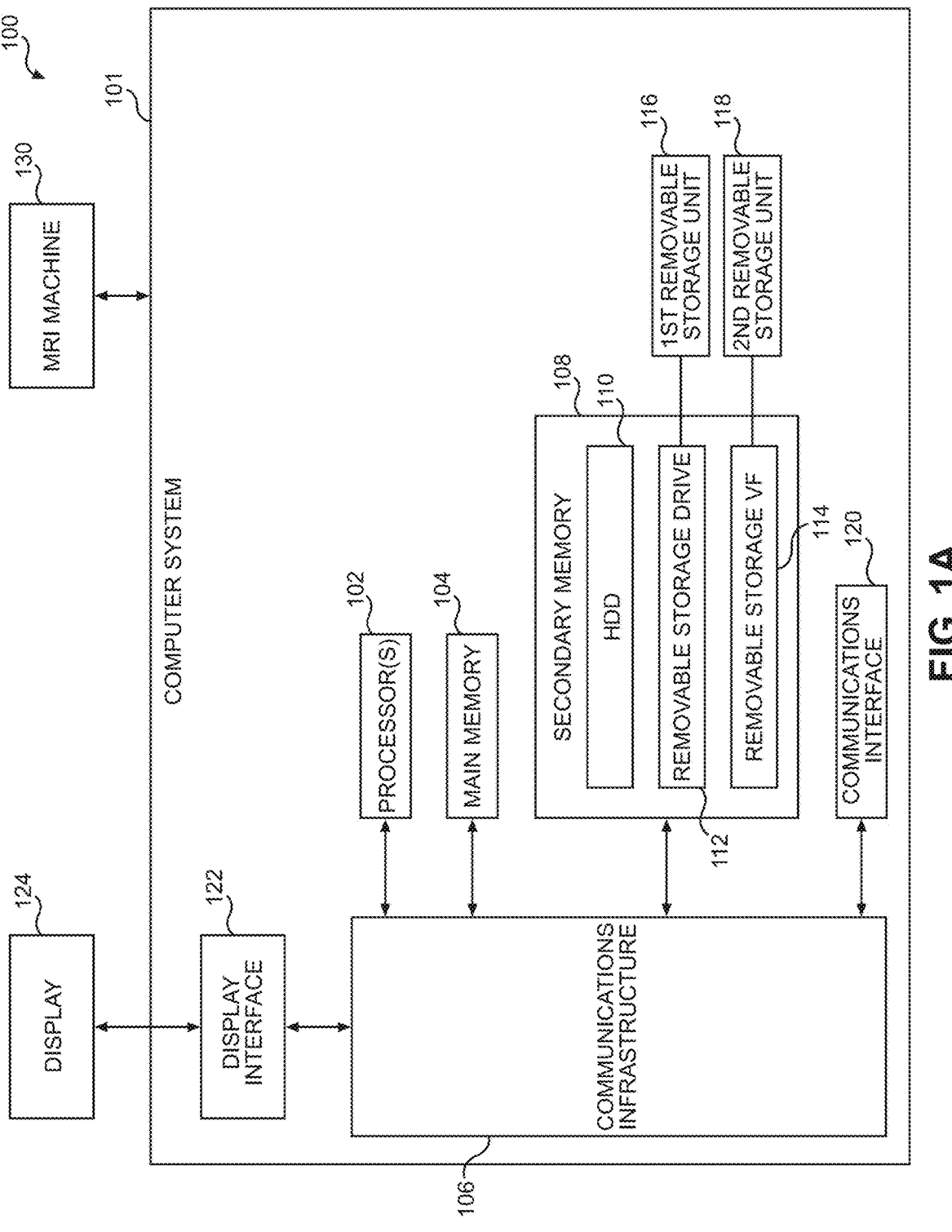
FIG. 1A is a block diagram of a system for implementing methods according to example embodiments.

Various example embodiments will now be described more fully with reference to the accompanying drawings in which only some example embodiments are shown. Specific structural and functional details disclosed herein are merely representative for purposes of describing example embodiments. Example embodiments, however, may be embodied in various different forms, and should not be construed as being limited to only the illustrated embodiments. Rather, the illustrated embodiments are provided as examples so that this disclosure will be thorough and complete, and will fully convey the concepts of this disclosure to those skilled in the art. Accordingly, known processes, elements, and techniques, may not be described with respect to some example embodiments. Unless otherwise noted, like reference characters denote like elements throughout the attached drawings and written description, and thus descriptions will not be repeated. The present invention, however, may be embodied in many alternate forms and should not be construed as limited to only the example embodiments set forth herein.

Detailed illustrative embodiments are disclosed herein. However, specific structural and functional details disclosed herein are merely representative for purposes of describing example embodiments. The example embodiments may, however, be embodied in many alternate forms and should not be construed as limited to only the embodiments set forth herein.

Independent of the grammatical term usage, individuals with male, female or other gender identities are included within the term.

As described herein, one or more example embodiments are directed to methods, systems, and/or apparatuses for performing a multi-echo stack-of-radial magnetic resonance imaging (MRI) acquisition with motion-resolved muti-dimensional regularized image reconstruction. More specifically, a free-breathing MRI method is described herein that may use motion-resolved reconstruction based on self-gating and multi-dimensional regularization with a modified extra-dimensional golden-angle radial sparse parallel (XD-GRASP) approach to provide improved image quality for the assessment of proton density fat fraction (PDFF) and transverse relaxation rate ($R_2^*$) in liver, as well as further derived biomarkers such as liver ion concentration (LIC).

The disclosed method can be extended to assess other MR parameters and biomarkers including, but not limited to, T1, T2/R2 and liver stiffness by Magnetic Resonance Elastography (MRE), and other potential applications. Although the following discussion focuses on a stack-of-radial sequence, it should be understood that the general techniques discussed herein can also be applied to other sequence types, including, but not limited to, a 3D radial (e.g., Koosh-ball) sequence. The proposed method may also be applied to qualitative and diagnostic imaging applications, including but not limited to 4D (3D spatial+1D motion state) MRI application in radiation oncology or therapy fields.

The disclosed method may improve the quality of biomarker measurements by improving image quality, reducing image artifacts, improving biomarker accuracy and precision, achieving higher signal to noise ratio, and/or shortening acquisition times.

Figure 1B:
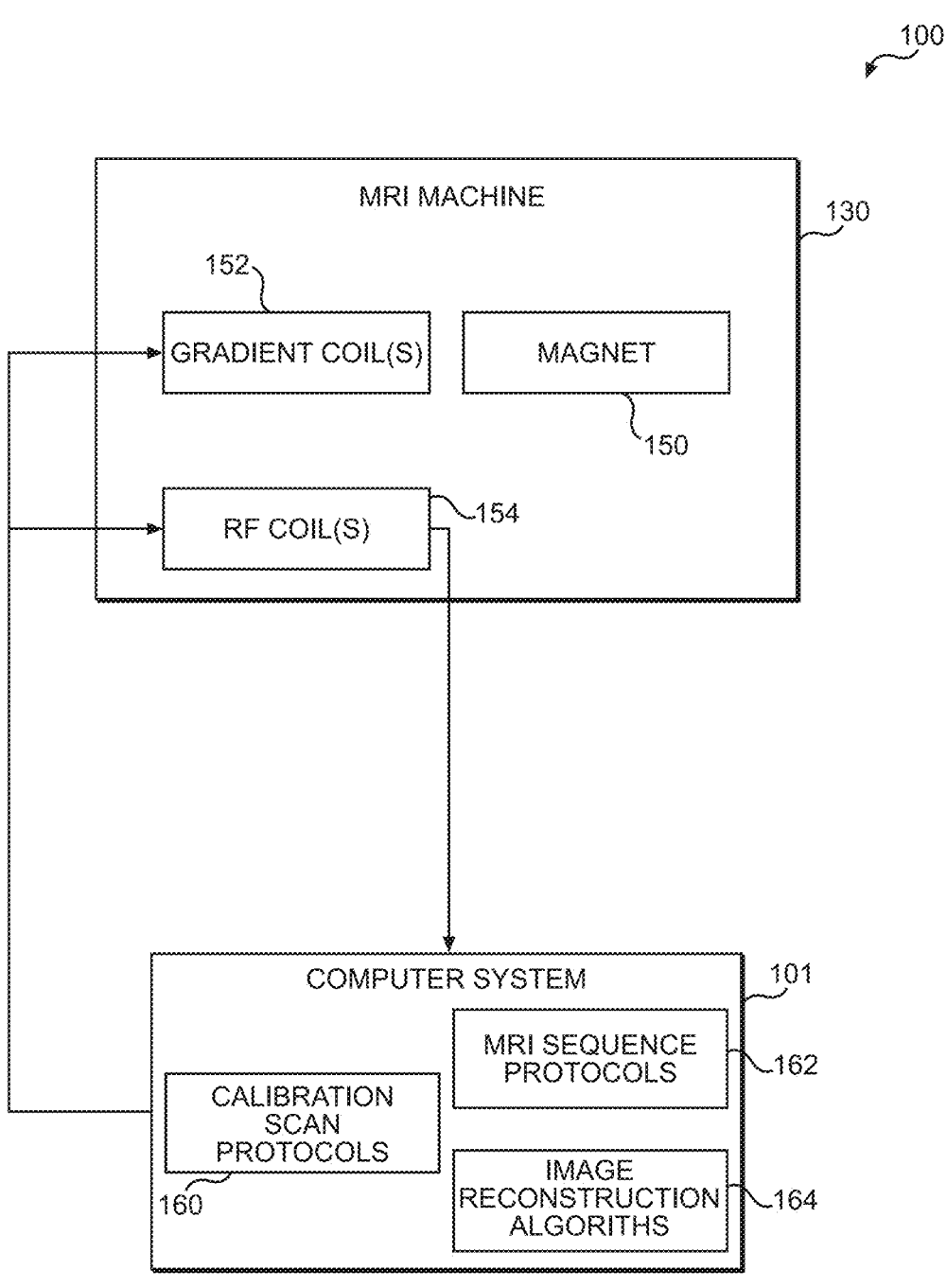
FIG. 1B is a block diagram of the magnetic resonance imaging (MRI) machine and the computer system of FIG. 1A according to an example embodiment.

In some embodiments, the systems and techniques described herein can be implemented in or by a medical imaging system, such as the medical imaging system 100 illustrated in FIGS. 1A and 1B.

FIG. 1A is an architecture diagram of medical imaging system 100 that may be used in some embodiments. As noted above, the medical imaging system 100 can include a computer system 101 and an imaging machine 130 (e.g., an MRI machine). The computer system 101 may include one or more processors 102. Each processor 102 is connected to a communication infrastructure 106 (e.g., a communications bus, cross-over bar, or network). The one or more processors 102 can include a CPU, a GPU, an AI accelerator, and/or a variety of other processor types. The computer system 101 may include a display interface 122 that forwards graphics, text, and other data from the communication infrastructure 106 (or from a frame buffer, not shown) for display on the display unit 124.

The computer system 101 may also include a main memory 104, such as a random access memory (RAM), and a secondary memory 108. The secondary memory 108 may include, for example, a hard disk drive (HDD) 110 and/or a removable storage drive 112, which may represent a floppy disk drive, a magnetic tape drive, an optical disk drive, a memory stick, or the like as is known in the art. The removable storage drive 112 reads from and/or writes to a first removable storage unit 116. The first removable storage unit 116 may be a floppy disk, magnetic tape, optical disk, or the like. As will be understood, the first removable storage unit 116 may include a computer readable storage medium having tangibly stored therein (embodied thereon) data and/or computer software instructions, e.g., for causing the processor(s) to perform various operations.

In alternative embodiments, the secondary memory 108 may include other similar devices for allowing computer programs or other instructions to be loaded into the computer system 101. The secondary memory 108 may include a second removable storage unit 118 and a corresponding removable storage interface 114, which may be similar to the removable storage drive 112, with the first removable storage unit 116. Examples of such removable storage units include, but are not limited to, USB or flash drives, which allow software and data to be transferred from the first removable storage unit 116 and/or the second removable storage unit 118 to the computer system 101.

The computer system 101 may also include a communications interface 120. The communications interface 120 allows software and data to be transferred between the computer system 101 and external devices. Examples of the communications interface 120 may include a modem, Ethernet card, wireless network card, a Personal Computer Memory Card International Association (PCMCIA) slot and card, or the like. Software and data transferred via the communications interface 120 may be in the form of signals, which may be electronic, electromagnetic, optical, or the like that are capable of being received by the communications interface 120. These signals may be provided to the communications interface 120 via a communications path (e.g., channel), which may be implemented using wire, cable, fiber optics, a telephone line, a cellular link, a radio frequency (RF) link and other communication channels.

In this document, the terms "computer program medium" and "non-transitory computer-readable storage medium" refer to media such as, but not limited to, media at the removable storage drive 112, a hard disk installed in the hard disk drive 110, or the first removable storage unit 116. These computer program products provide software to the computer system 101. Computer programs (also referred to as computer control logic) may be stored in the main memory 104 and/or the secondary memory 108. Computer programs may also be received via the communications interface 120. Such computer programs, when executed by a processor, enable the computer system 101 to perform the features and/or operations of the methods discussed herein. For example, the main memory 104, the secondary memory 108, the first removable storage unit 116, or the second removable storage unit 118 may be encoded with computer program code (instructions) for performing operations corresponding to various processes disclosed herein.

Referring now to FIG. 1B, the imaging machine 130 can include a magnet 150 extending along a bore that is configured to receive a patient therein and that is configured to produce a generally uniform magnetic field, one or more gradient coils 152 that are configured to produce magnetic field gradients (e.g., linear gradients), and one or more RF coils 154 that are configured to transmit to RF signals to the patient's body and/or receive RF signals therefrom. The computer system 101 (embodiments of which are described in greater detail above) can store and implement calibration scan protocols 160, MRI sequences protocols 162, and/or image reconstruction algorithms 164, as well as a variety of other software modules known in the technical field. The MRI sequence protocols 162 can be embodied as instructions that, when executed by the computer system 101, cause the computer system 101 to control the one or more gradient coils 152 and/or the one or more RF coils 154 to apply a particular sequence of magnetic field gradients and/or RF pulses to the patient. The image reconstruction algorithms 164 can be embodied as instructions that, when executed by the computer system 101, cause the computer system 101 to reconstruct an image of the patient based on the RF signal received from the patient (e.g., by the one or more RF coils 154) as caused by the MRI sequence applied thereto. The calibration scan protocols 160 can likewise be embodied as instructions that, when executed by the computer system 101, cause the computer system 101 to apply particular MRI sequences and/or imaging trajectories (e.g., non-Cartesian trajectories) to calibrate the imaging machine 130 for imaging acquisition and/or parameter mapping applications.

It is understood by those familiar with the art that the system described herein may be implemented in hardware, firmware, or software encoded (e.g., as instructions executable by a processor) on a non-transitory computer-readable storage medium.

FIGS. 2A-2C illustrate example pulse sequences for data acquisition that may be used with the techniques described herein. The slice-select direction may align with the z axis of the gradient system such that the in-plane axes may be the x and y axes. The pulse sequence may contain two modules, including the gradient delay calibration acquisition module and the imaging acquisition module as shown in FIG. 2A.

As is generally understood in the art, gradient delays and related effects can cause differences between the specified k-space trajectory and the k-space trajectory that is actually acquired. This could, in turn, degrade the image that is reconstructed from the acquired data. To avoid such degradation, the MRI scanner may be calibrated to eliminate or compensate the differences during acquisition or reconstruction. In the gradient delay calibration acquisition module shown in FIG. 2B, data from positive and negative gradient polarities are acquired in both the x and y directions, and cross-correlated to calculate the k-space sample shifts in the $k_X$ and $k_Y$ directions, respectively. The measured k-space sample shifts may be used to correct the k-space trajectory for readouts along each azimuthal angle. In some embodiments, gradient delay calibration is performed for each contrast and each channel. As used herein, contrast is referring to an echo of an imaging process performed by an MRI system. The imaging acquisition module is shown in FIG. 2C. Radial readout views are acquired for all $k_Z$ increments before rotating to the next azimuthal angle.

Figures 3A, 3B, 3C:
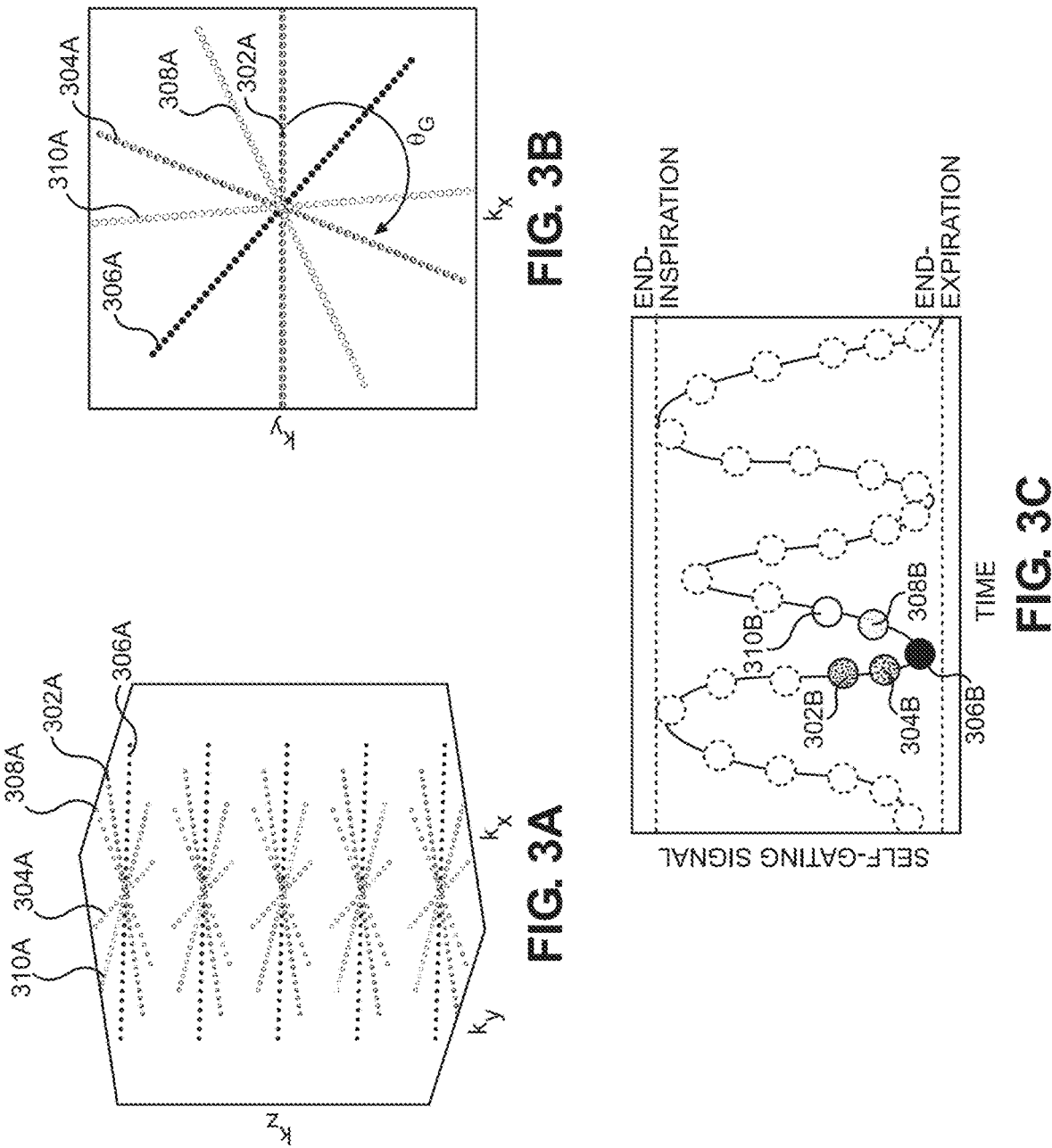
FIG. 3A is a stack-of-radial k-space sampling trajectory in a three-dimensional (3D) view where radial readout views with the same azimuthal angle are acquired for all $k_z$ locations before rotating according to an example embodiment.
FIG. 3B is a 2D view of the k-space sampling trajectory of FIG. 3A where a radial readout view is rotated by $\theta_G$ to a next radial readout view angle according to an example embodiment.
FIG. 3C is a self-gating signal curve and MRI data sampling corresponding to FIGS. 3A and 3B.

Example k-space sampling trajectories and self-gating signals are shown in FIGS. 3A and 3B. More specifically, FIG. 3A shows an example stack-of-radial k-space sampling trajectory in the 3D view. Radial readout views with the same azimuthal angle are acquired for all $k_Z$ locations before rotating. In this example, five radial readout azimuthal angles are illustrated in a sequential acquisition order. The five radial readout azimuthal angles may include a first angle 302, a second angle 304, a third angle 306, and fourth angle 308, and a fifth angle 310. The dot at the k-space origin denotes that the corresponding self-gating points are sampled when radial readout views cross it. FIG. 3B shows a 2D view of the k-space sampling trajectory of FIG. 3A. In FIG. 3B, the radial readout view is rotated by the golden-angle increment $\theta_G$ to the next radial readout view angle. For example, the first angle 302A is rotated by $\theta_G$ to the next radial readout view angle, the second angle 304A.

FIG. 3C shows an illustration of a self-gating signal curve and sampling corresponding to FIGS. 3A and 3B. The solid curve is the continuous self-gating signal curve to sample. The solid dots are the self-gating signal points corresponding to the acquired k-space data as shown in FIGS. 3A and 3B. In particular, first dot 302B corresponds to the first angle 302A, second dot 304B corresponds to the second angle 304A, third dot 306B corresponds to the third angle 306A, fourth dot 308B corresponds to the fourth angle 308A, and fifth dot 310B corresponds to the fifth angle 310A. The empty dots indicate additional data sampled by radial readout views not shown in FIGS. 3A and 3B. For better visualization, only part of the k-space sampling trajectory and the self-gating signal points are shown in FIGS. 3A-3C.

The data points of the radial readout views of the first contrast at the k-space origin are sampled as the corresponding self-gating signal (FIGS. 2C, 3A and 3C). In some embodiments, data points of a contrast other than the first contrast at the k-space origin may be sampled as the corresponding self-gating signal. Therefore, the temporal resolution of the self-gating signal is determined by the repetition time (TR) and the number of phase encoding steps in the slice direction, i.e., $t_{sG} = TR \times N_{stc} \times (1 + P_{stc\_os})$, where $N_{stc}$ is the imaging slice number and $P_{stc\_os}$ is the slice oversampling percentage. The self-gating signal curve is correlated to the underlying respiratory motion curve (as shown in FIG.

3C). The values of the self-gating signal data points are used to retrospectively determine the respiratory motion states that the acquired radial readout views belong to. An acceptance rate is used to specify the percentage of the acquired radial readout views which are most adjacent to a desired motion state, such as end-expiration, and a fixed overall acceptance window was determined and applied to the full duration of each self-gating signal curve to select those views for image reconstruction. Lastly, the gradient-delay-corrected and motion-compensated multi-echo data are further processed to calculate the PDFF and $R_2^*$ values.

In some embodiments, the sequence is implemented to run inline and generate Digital Imaging and Communications in Medicine (DICOM) files using the sequence and image reconstruction framework of an MRI scanner, which may also be capable of retrospective offline reconstruction using the raw data files. To improve visualization and reconstruction performance, an image background mask may be obtained from the sequence adjustment data to exclude most of the background air region from the calculation of PDFF and $R_2^*$. The self-gating signal data may also be exported (e.g., as text files) for further analysis.

Additional details related to FIGS. 2A-3C may be found in U.S. Pat. No. 11,175,366, assigned to Siemens Healthcare GmbH, filed on Feb. 5, 2020 and U.S. Pat. No. 11,333,734, assigned to Siemens Healthcare GmbH, filed on May 7, 2020, the entirety of each of which is incorporated herein by reference.

Figure 4:
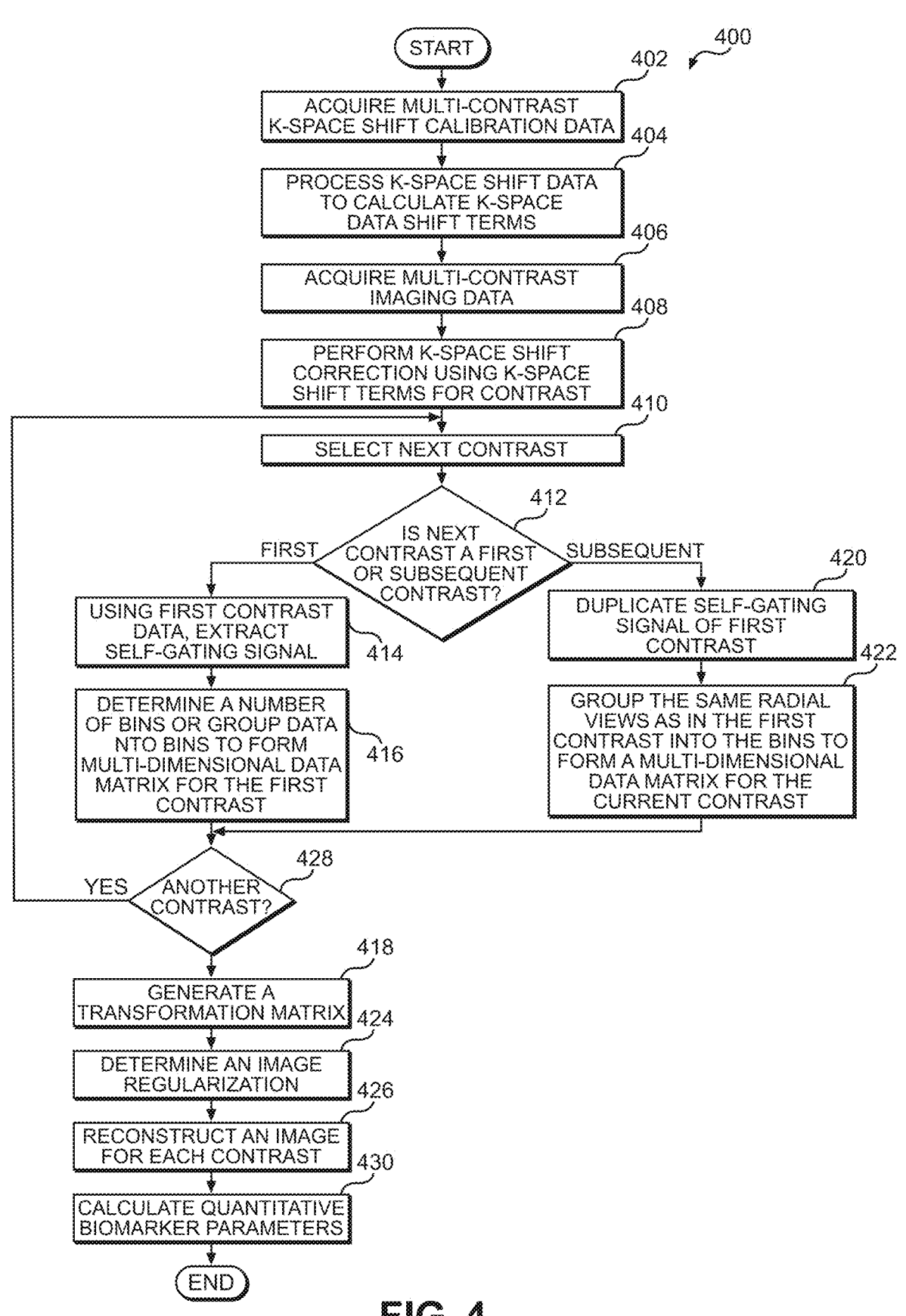
FIG. 4. is a flow chart of a method of generating biomarker parameters using an MRI system according to an example embodiment.

FIG. 4 is a flow chart illustrating a method 400 of data acquisition and data processing steps for a free-breathing MRI method utilizing motion-resolved reconstruction based on self-gating and multi-dimensional regularization with a modified XD-GRASP approach, according to some embodiments. Although described herein as using a self-gating technique, other approaches such as using physiological signals measured by specific hardware can be used as alternatives to self-gating techniques.

A free-breathing multi-echo GRE stack-of-radial imaging sequence with golden-angle ordering may be used for the data acquisition. The acquired k-space data may undergo data processing steps such as k-space shift correction, self-gating, multi-dimensional regularization, and quantification of PDFF and $R_2^*$, as described subsequently. For example purposes, the example embodiment shown in FIG. 4 will be discussed with regard to the system shown in FIGS. 1A and 1B. However, example embodiments should not be limited to this example. For example, different steps of the method 400 may be performed or executed by different processors or computer systems. In particular, one or more data acquisition steps may be executed or deployed via a first processor of a computer system and one or more data processing steps may be executed or deployed via a second processor such as a processor of a computer or computer system or cluster separate from the computer system of the first processor.

Example free-breathing multi-echo GRE stack-of-radial imaging sequences that may be used with the techniques described herein are described in: Zhong X, Armstrong T, Nickel M D, Kannengiesser S A R, Pan L, Dale B M, Deshpande V D, Kiefer B, Wu H H. Effect of respiratory motion on free-breathing three-dimensional stack-of-radial liver $R_2^*$ relaxometry and improved quantification accuracy using self-gating. Magn Reson Med 2019. Example golden angle ordering schemes are described in Block K T, Chandarana H, Milla S, Bruno M, Mulholland T, Fatterpekar G, Hagiwara M, Grimm R, Geppert C, Kiefer B, Sodickson D K. Towards routine clinical use of radial stack-of-stars 3D gradient-echo sequences for reducing motion sensitivity. J Korean Soc Magn Reson Med 2014; 18:87-106; and Fujinaga Y, Kitou Y, Ohya A, Adachi Y, Tamaru N, Shiobara A, Ueda H, Nickel M D, Maruyama K, Kadoya M. Advantages of radial volumetric breath-hold examination (VIBE) with k-space weighted image contrast reconstruction (KWIC) over Cartesian VIBE in liver imaging of volunteers simulating inadequate or no breath-holding ability. Eur Radiol 2016; 26:2790-2797, all of which are incorporated herein by reference in their entirety.

Self-gating multi-binning techniques discussed herein can be applied to other free-breathing imaging methods which need multiple measurements in one data dimension, (e.g., multiple contrasts at different TEs). Other possible sequences include, without limitation, free-breathing T1, T2 and MRE with the radial-based and spiral-based acquisitions. The technique may also be applied to derived parameter maps (i.e., the averaging applied not to the contrast images, but to parameter maps derived for each motion state).

Starting at step 402 in FIG. 4, an initial data acquisition procedure may be performed. For this acquisition, the processor 102 may program the MR pulse sequence to acquire the multi-contrast k-space shift calibration data in both the $K_x$ and $K_y$ directions.

Next, at step 404, a data processing procedure is performed by the processor 102 to process the k-space shift calibration data to calculate the k-space data shift terms in both the $K_x$ and $K_y$ directions for each contrast.

At step 406, a second data acquisition procedure is performed where the MR pulse sequence may be programmed by the processor 102 to acquire the multi-contrast imaging data. The multi-contrast imaging data may be acquired resulting from application of a pulse of an MRI system. In at least one example embodiment, the multi-contrast imaging data may be a first multi-dimensional data matrix that may be reconstructed by subsequent steps of the method 400. In at least one example embodiment, the first multi-dimensional data matrix may be a four-dimensional (4D) data matrix that may include three dimensions of spatial data and one dimension of motion data. In other embodiments, the first multi-dimensional data matrix may have more or less than four dimensions.

In at least one example embodiment, the multi-contrast imaging data may be acquired using a radial imaging sequence which may be a three-dimensional radial sequence. In at least one example embodiment, a stack-of-star trajectory is used to acquire the imaging data. This data may be radial in two in-plane dimensions and may be linear or Cartesian in a through-plane dimension. In at least one example embodiment, a self-gating signal may be extracted from the multi-contrast imaging data by sampling a plurality of radial views included in the multi-contrast imaging data. In at least one example embodiment, the self-gating signal may be extracted from a first contrast. The self-gating signal may alternatively be extracted from a contrast other than the first contrast in at least one example embodiment.

Then, at step 408, a second data processing step may be performed where a k-space shift correction is performed by the processor 102 using the k-space data shift terms calculated at step 404 for each radial readout view of each contrast acquired at step 406. As described above, contrast as used herein refers to an echo of an imaging process performed by an MRI system. In some instances, "echo" and "contrast" may be used interchangeably.

At step 410, the processor 102 may select a next contrast. In at least one example embodiment, the next contrast may be either a first or a subsequent contrast. The contrast to be processed may be selected in a temporal order. For example, the first contrast, may be temporally the first contrast and a next contrast, after the first contrast, may be the contrast temporally following (e.g., sequentially following) the first contrast. As discussed with regard to FIG. 4, the contrast currently being processed, whether a first contrast or a subsequent contrast, may also be referred to as a current contrast.

The method 400 may continue to conditional step 412 after the next contrast is selected at step 410. At the conditional step 412, the processor 102 may determine whether the next contrast is the first contrast or a subsequent contrast. If the next contrast is a first contrast being processed, then the method 400 may proceed to step 414 and step 416 prior to step 428. If the next contrast is a contrast other than the first contrast, then the method 400 may proceed to step 420 and step 422 prior to step 428.

At step 414, the processor 102 uses the data of the current contrast, such as the first contrast, to extract the self-gating signal from the points at the k-space origin when radial readout views cross the k-space origin.

At step 416, the processor 102 determines a number of bins (e.g., 5 bins) and groups the acquired radial readout views of the k-space data into multiple bins to form a second multi-dimensional data matrix for the first echo. In at least one example embodiment, the second multi-dimensional data matrix may include the k-space data assigned to k-space and motion-state dimensions. In at least one example embodiment, the number of bins may be defined, input, acquired, determined, or alternatively, predetermined. For example, an MRI operator may determine the number of bins. In at least one example embodiment, the second multi-dimensional data matrix may be a 4D data matrix. In other embodiments, the second multi-dimensional data matrix may have a number of dimensions other than 4D.

Returning to conditional step 412, if the next contrast is a contrast other than the first contrast (a subsequent contrast), then at step 420 the processor 102 duplicates the self-gating signal of the first contrast.

Once the self-gating signal is duplicated, at step 422 the processor 102 groups the same radial views as in the first contrast into the multiple bins to form a multi-dimensional data matrix for the current (subsequent) contrast.

After step 416 or step 422, the method 400 may proceed to conditional step 428. At step 428, the processor 102 determines whether there is another contrast to process. In at least one example embodiment, the number of contrasts may be defined, determined, or alternatively, predetermined, by the acquisition such that the processor 102 is able to determine if there is another contrast to process based on the number of contrasts that were determined by the acquisition and the number of contrasts that have already been processed. In at least one example embodiment, the number of contrasts may be set by an MRI operator prior to the start of the method 400. If there is another contrast, the method returns to step 410 to select a next contrast. If there is not another contrast, the method proceeds to step 418, where a transformation matrix is generated.

At step 418, the transformation matrix may be generated by the processor 102 for each contrast. In at least one example embodiment, the transformation matrix may include at least one of a coil sensitivity map, and/or a non-uniform Fourier transform. The transformation matrix may be a catch-all matrix that may collectively apply one or more relevant operations. For example, relevant operations may include multiplication with coil sensitivity maps and non-uniform Fourier transformation. These relevant operations may be well understood by persons of skill in the art. Examples of these relevant operations include coil sensitivity map calculation as described in Pruessmann, K. P., Weiger, M., Brnert, P. and Boesiger, P. (2001), Advances in sensitivity encoding with arbitrary k-space trajectories. Magn. Reson. Med., 46: 638-651. https://doi.org/10.1002/mrm.1241 and non-uniform Fourier transform as described in S. Bagchi S, Mitra S K. The Nonuniform Discrete Fourier Transform and Its Applications in Signal Processing, Norwell, MA, USA: Kluwer Academic Publishers, 1999, the entirety of each of which is incorporated herein by reference.

After the transformation matrix is calculated at step 418, at step 424 the processor 102 may determine an image regularization for each contrast. In one or more example embodiments, the image regularization may involve a linear transformation for each contrast and may include at least one regularization factor. The at least one regularization factor may be at least one of a regularization factor for spatial regularization or motion-state regularization in at least one example embodiment.

In one or more example embodiments, an image regularization may be applied to the data of each contrast jointly. For example, the regularization may relate to the images of different contrasts such as by an additional term using locally low-rank constraints along an echo direction. This technique may be used depending on characteristic needs of a specific application.

After step 424, at step 426 the processor 102 may reconstruct an image for each contrast based on an optimization equation including the first multi-dimensional data matrix, the second multi-dimensional data matrix, the transformation matrix, and the image regularization. In at least one example embodiment, the transformation matrix may be applied to the first multi-dimensional data matrix for each contrast to obtain a transformed multi-dimensional data matrix.

In one or more example embodiments, the optimization equation may be $$\frac{1}{2}\|Ax - y\|_2^2 + \|W(\alpha, \beta)x\|_1$$

where A is the transformation matrix, x is the first multi-dimensional data matrix, y is the second multi-dimensional data matrix, and W is the image regularization. In at least one example embodiment, $\alpha$ and $\beta$ may be regularization constants and $W(\alpha,\beta)$ may be a redundant Haar wavelet transformation that may be applied in the in-plane spatial and motion-state dimensions whose low-pass and high-pass filters are separately scaled by the individual regularization constants $\alpha$ and $\beta$. $\|\cdot\|_2$ is the Euclidean $l_2$-norm, and $\|\cdot\|_1$ is the $l_1$-norm. In other example embodiments, a different optimization equation may be used to reconstruct the image of each contrast.

In at least one example embodiment, after the initial reconstruction described above, the radial views may be reassigned to new motion states using the optimization equation. Then, the process of step 402 to step 426 may be repeated, potentially until each radial view is close to the image of its assigned motion state. In particular, assignment of radial views to motion states may traditionally be completed prior to reconstruction based on a navigation signal. This assignment may not be accurate and thus, images may be calculated based on a first assignment and then the data may be reassigned. In at least one example embodiment, a signal model may be employed in the reconstruction, which may relate reconstructed images to acquired data, and may reassign to the motion state whose image fits best to an acquired data sample.

At step 430, the processor 102 may calculate the quantitative biomarker parameters such as PDFF, $R_2^*$ and LIC. The quantitative biomarker parameters may be calculated based on the multi-echo images that are reconstructed at step 426. Techniques for calculating biomarkers are generally understood in the art and may be applied by the processor 102 at step 426. In one or more example embodiments, the quantitative biomarker parameters may be saved and/or output after they are calculated.

In at least one example embodiment, the quantitative biomarker parameters may be used for diagnostic purposes. For example, a PDFF map, which is defined as the value of fat/(water+fat) for each pixel on the image, can be generated to provide a quantitative fat measurement after correcting for confounders. In particular, normal fat content of the liver is zero. PDFF may measure of how much fatty infiltration is present, which is a hallmark of fatty liver disease. In certain cases, elevated PDFF is associated with a poor health prognosis, and/or presents a contra-indication for certain procedures (e.g., for living liver donors). Maps of tissue transverse relaxation values (T2 or T2*) or relaxation rates (R2=1/T2 or $R_2^*$=1/T2*) may be calculated when calculating the fat fraction maps, which are strong indicators of iron content. In particular, $R_2^*$ may be used to stage the severity of liver iron overload, which may occur in certain diseases or through regular blood transfusions. Liver iron levels may be a marker of total body iron and strong systemic iron overload may present a health risk. PDFF and $R_2^*$ are routinely performed in clinical practice and the systems and methods described herein may provide improved PDFF and $R_2^*$ parameters for diagnostic purposes. In addition, relaxation rate can be assessed directly, or alternatively converted to LIC values for iron estimation.

In at least one example embodiment, the multi-echo images that are reconstructed at step 426 may additionally be used for qualitative and diagnostic imaging applications. For example, these images may be used in a radiation or oncology therapy area.

The method of FIG. 4 may include optional constraints on smoothness of breathing motion in at least one example embodiment. Additionally, in at least one example embodiment, the method 400 may be applied to parameter maps for each motion state.

Figure 5:
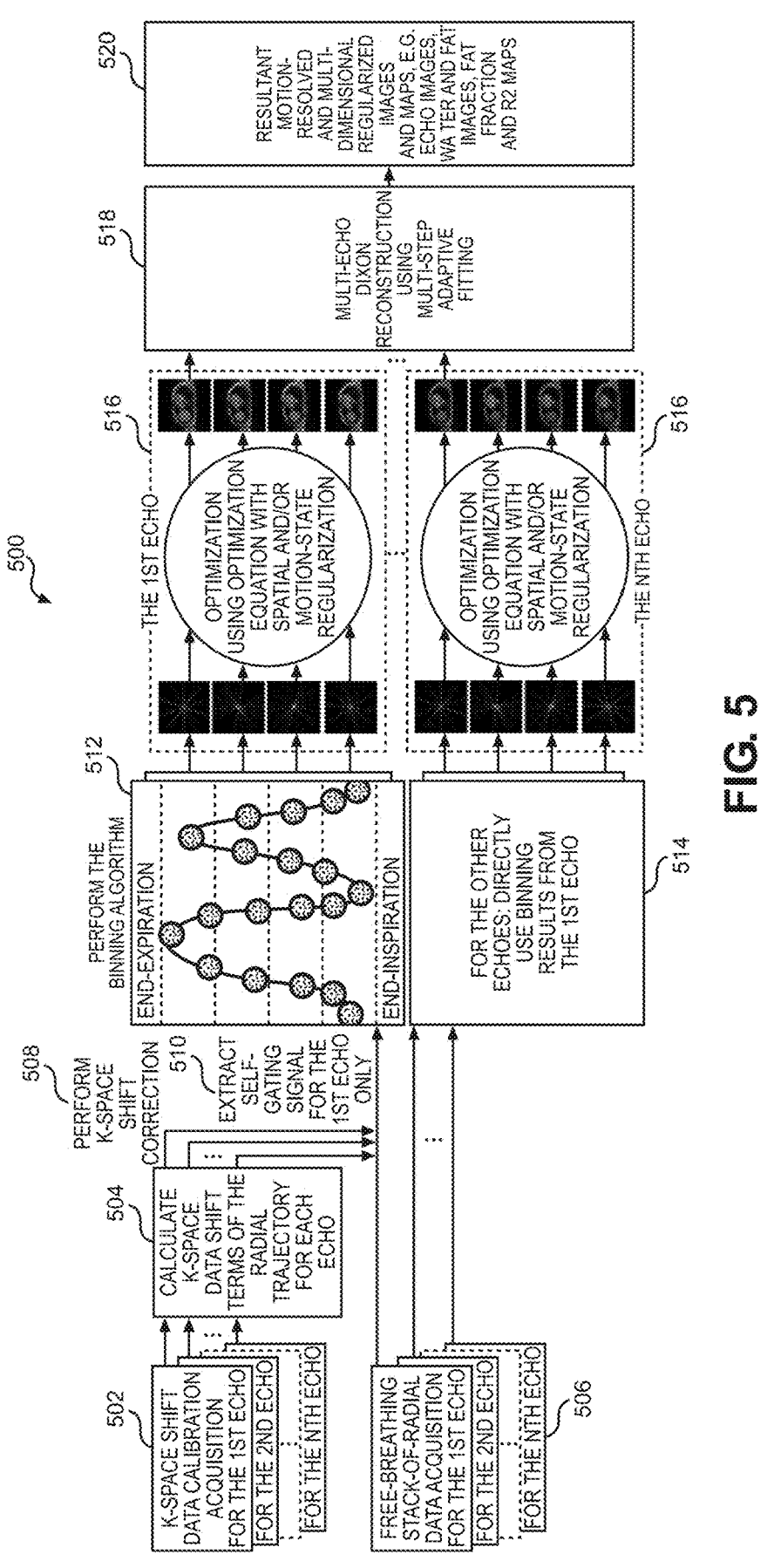
FIG. 5 is a block diagram of data acquisition and processing steps of the method of FIG. 4 according to an example embodiment.

FIG. 5 is a block diagram 500 of the method 400 of FIG. 4 according to at least one example embodiment. Step 402 of the method 400 may correspond to block 502 where k-space shift calibration data is acquired. This k-space shift calibration data may be multi-contrast data. Step 404 of the method 400 may correspond to block 504 where the k-space shift calibration data is processed to calculate k-space data shift terms. Step 406 of the method 400 may correspond to block 506 where multi-contrast imaging data may be acquired. The multi-contrast imaging data may be acquired for multiple contrasts and in at least one example embodiment may be acquired using a free-breathing stack-of-radial data acquisition process. Step 408 of the method 400 may correspond to process 508 where a k-space shift correction is performed.

In at least one example embodiment, a self-gating signal is retrospectively extracted in a single continuous free-breathing scan acquired with a stack-of-radial imaging acquisition. For the first contrast, a self-gating signal is extracted at process 510 and a binning algorithm is performed at block 512. The self-gating signal may be used to characterize the respiratory motion curve and determine the respiratory motion phases. The acquired radial readout views may be grouped into multiple bins corresponding to the respective respiratory motion phases. The process 510 may correspond to step 414 of the method 400 and the block 512 may correspond to step 416 of the method 400. For subsequent contrasts, the self-gating signal of the first contrast is duplicated and the same radial views as in the first contrast are grouped into bins at block 514. The block 514 may correspond to step 420 and step 422 of the method 400.

At block 516, an optimization may be performed with at least one image regularization. The block 516 may correspond to at least step 418, step 424, and step 426 of the method 400. This optimization may be performed for each contrast in at least one example embodiment. This optimization may result in bin images that may be reconstructed using an optimization equation including spatial and/or motion-state regularization. For example, the optimization equation described above with reference to FIG. 4 may be used for the image reconstruction.

Following the optimization, at block 520 a multi-contrast Dixon reconstruction may be performed using a multi-step adaptive fitting approach to generate images and maps such as echo images, water and fat images, PDFF, $R_2^*$ maps, etc. In at least one example embodiment, block 520 may correspond to step 430 of the method 400. This approach is described in further detail in Zhong, X., Nickel, M. D., Kannengiesser, S. A., Dale, B. M., Kiefer, B. and Bashir, M. R. (2014), Liver fat quantification using a multi-step adaptive fitting approach with multi-echo GRE imaging. Magn. Reson. Med., 72: 1353-1365. doi:10.1002/mrm.25054, the entire contents of which are incorporated herein by reference. In general, Dixon imaging uses multiple acquisitions with different contrast times to achieve fat-water phase differences and subsequently separate fat and water images. A fat fraction map, which is defined as the value of fat/(water+fat) for each pixel on the image, may then be generated. Simultaneously, the maps of tissue transverse relaxation values (T2 or T2*) or relaxation rates (R2=1/T2 or $R_2^*$=1/T2*) may be calculated when calculating the fat fraction maps. These maps may be strong indicators of iron content. In addition, the maps can be assessed directly, or alternatively converted to LIC values for iron estimation. In some embodiments, the images may be processed using the multi-step adaptive fitting algorithm to calculate the PDFF, $R_2^*$ values. In some embodiments, the calculation of parameter maps can be performed for each self-gated bin, and the optimization can be subsequently performed in the parameter maps of each bin.

As proof of concept and demonstration of the techniques and methods described herein, both in vivo and motion phantom data was collected and processed. The motion phantom data included stack-of-radial MRI data of a custom phantom scanned at 3T. The motion phantom included four vials containing ferumoxytol solutions with concentrations of 0, 25, 37 and 50 ug/mL to achieve a range of $R_2^*$ values, as well as a saline bag and a plastic holder filled with 100% high gel strength agar. Additional information about the motion phantom can be found in Zhong X, Hu H H, Armstrong T, Li X, Lee Y H, Tsao T C, Nickel M D, Kannengiesser S A R, Dale B M, Deshpande V, Kiefer B, Wu H H. Free-breathing volumetric liver $R_2^*$ and proton density fat fraction quantification in pediatric patients using stack-of-radial MRI with self-gating motion compensation. J Magn Reson Imaging 2021; 53:118-129, the entire contents of which are incorporated herein by reference.

During the acquisitions, a programmable motion stage was used to move the holder and four vials according to a pre-recorded respiratory motion waveform. The saline bag remained stationary throughout the experiment. Another acquisition was performed using imaging parameters consistent with the acquisition described above where the four vials were moved in a pre-recorded waveform where the phantom remained completely stationary to serve as a reference. Imaging parameters for each of the data acquisitions are shown in the phantom data of FIG. 6.

512 was chosen as the fully sampled number of radial views in this phantom imaging protocol. Originally acquired with 768 radial views (oversampled, corresponding to a sampling factor of 1.5), raw data were undersampled to 512, 256, 128 and 64 radial views, equivalent to a sampling factor of 1.0, 0.5, 0.25 and 0.125 respectively. Data with different radial views were reconstructed with different methods for comparison.

Mono-exponential fitting was used to calculate $R_2^*$. Using ImageJ 1.52n, regions of interest (ROIs) were placed inside the vials, holder and saline bag on each of two slices, one near the vial tips and the other at the center location of the vials. $R_2^*$ values within the ROIs at the first motion state were reported as mean standard deviation (SD) and compared to reference values without motion using Bland-Altman Analysis with mean difference (MD) and limits of agreement (LoA=MD±1.96×SD), which were reported as [MD; lower LoA, upper LoA].

The in vivo data was collected from a study that was performed compliant with the Health Insurance Portability and Accountability Act (HIPPA) and approved by a local Institutional Review Board (IRB). Five normal patients with no known prior liver conditions (one female, 34.6±4.8 years) with BMI of 22.6±3.5 kg/m$^2$ and 6 patients with non-alcohol fatty liver disease (three females, 58.5±9.5 years) with BMI of 28.9±2.7 kg/m$^2$ were identified and included were recruited. After written informed consent was obtained, each subject was scanned at 3T. Imaging was performed using an anterior 18-channel flexible array coil in combination with 12-16 elements of the table-mounted spine array coil.

Data from the patients was originally acquired with fully sampled radial views (404 or 352, corresponding to a sampling factor of 1.0). Raw data were undersampled by factors of 0.5, 0.25 and 0.125 for comparison. Data with different radial views were reconstructed with different methods for comparison. Data from a breath-hold multi-echo Cartesian GRE acquisition was used as a reference. Imaging parameters for each of the data acquisitions are shown in the in vivo data of FIG. 6.

Multi-step adaptive fitting was performed for PDFF and $R_2^*$ quantification. The first and second echo images were used as anatomic references and 12 ROIs for each subject were manually placed using ImageJ by a researcher with over 10 years of abdominal MRI research experience in the following liver segments on four slices in the $R_2^*$ maps of the breath-hold Cartesian acquisition while avoiding large vessels: liver segments VII and VIII in the near-dome slice, II, IVa, VII and VIII in the upper-mid-level slice, III, IVb, V and VI in the lower-mid-level slice, and V and VI in the inferior slice. These ROIs were then transferred to the anatomically matching slices of the $R_2^*$ maps of the free-breathing radial acquisition. PDFF and $R_2^*$ values within the ROIs were measured in resultant DICOM images at the first motion state (the end expiration state) using a custom script and were compared to reference values measured by breath-hold Cartesian using Bland-Altman analysis. The SD values within the ROIs were displayed as error bars in the Bland-Altman plots.

For all statistical analyses of the phantom and in vivo data, a P-value<0.05 was regarded as significantly different. Parameter optimization and statistical analysis were performed in the following three steps.

To determine the recommended number of motion-state bins (4 or 8) and the recommended motion-state regularization parameter 3 for the XD-GRASP methods, a linear mixed-effects model was used to fit the in vivo data from 12 ROIs on each of 11 subjects acquired with one of five different methods with different regularization parameters. The random effects were ROIs nested within subjects. The fixed effects were the method and the 3 value, as well as their interactions. This allowed testing the 1 value on a per-method basis while controlling for the effects of variations among different ROIs and subjects. Post-hoc tests were performed using Tukey's method of adjusting for multiple comparisons. Mean values within ROIs were used to evaluate the quantification bias. SD values were used to evaluate the variation due to the influence of undersampling and motion artifact suppression on the quantification maps. The different methods included breath-hold Cartesian, 4-bin XD-GRASP radial with $\beta=0$, 4-bin XD-GRASP radial with $\beta\neq0$, 8-bin XD-GRASP radial with $\beta=0$, 8-bin XD-GRASP radial with $\beta\neq0$. The spatial regularization parameter $\alpha$ was kept at the same value as used in the vendor specific GRASP implementation in this study. The motion-state regularization parameter $\beta$ in this step were scaled by 20, 80, 200, 2000, $2\times10^4$ and $2\times10^8$. The recommended number of bins and $\beta$ value determined by the test were then used for the XD-GRASP method in the remaining two steps of statistical analysis.

In addition to mean and SD values of PDFF and $R_2$*, the coefficient of variation (CV) (i.e., the ratio of SD/mean) was calculated for the pixel intensity values within the ROIs on the first echo image as a rough metric of quality of the source images, which collectively considered the factors including SNR as well as undersampling and motion artifacts. Since the ROI's were chosen in homogenous regions, substantial variations reflect relatively poor image quality, regardless of whether the variation was attributable to SNR or some artifacts.

Second, a linear mixed-effects model was used to fit the phantom data. In the model, the ROI and the slice location were random effects, and the method and sampling factor were the fixed effects. This allowed testing for the overall effects of methods while controlling for the differences between different ROIs and different slice locations. The sampling factor was treated as a fixed effect instead of a covariate because the effects of the sampling factor were not expected to be linear. Mean and SD values of $R_2$* were analyzed using a paired test between different methods and the reference measurements without motion to evaluate significant biases (for mean) and motion artifact induced variations not corrected by the reconstruction method (for SD) respectively. Different methods were also compared to each other pairwise to evaluate any significant differences between methods. Post-hoc tests were performed using estimated marginal means with the Tukey method of adjustments for multiple comparisons. CV values of the pixel intensities on the first echo image were analyzed using an unpaired test, for which only the tests of the differences were meaningful.

Lastly, the in vivo results were also fit to a linear mixed-effects model. The subject, slice location, and ROI were nested random effects (within-subject), and the method and sampling factor were the fixed effects. Similarly, this allowed testing for the overall effects of methods while controlling for the differences between different subjects and different ROIs at different slice locations within the subject. Mean and SD values of PDFF and $R_2$* were analyzed using a paired test between different methods and the reference breath-hold Cartesian method to evaluate significant biases and respiratory motion artifact induced variations not corrected by the reconstruction method respectively. Different methods were also compared pairwise to evaluate any inter-method differences. Post-hoc tests using estimated marginal means with the Tukey method of adjustments were performed for multiple comparisons. CV values of the pixel intensities on the first echo image were also analyzed using an unpaired test and only the inter-method differences were tested.

Figure 7:
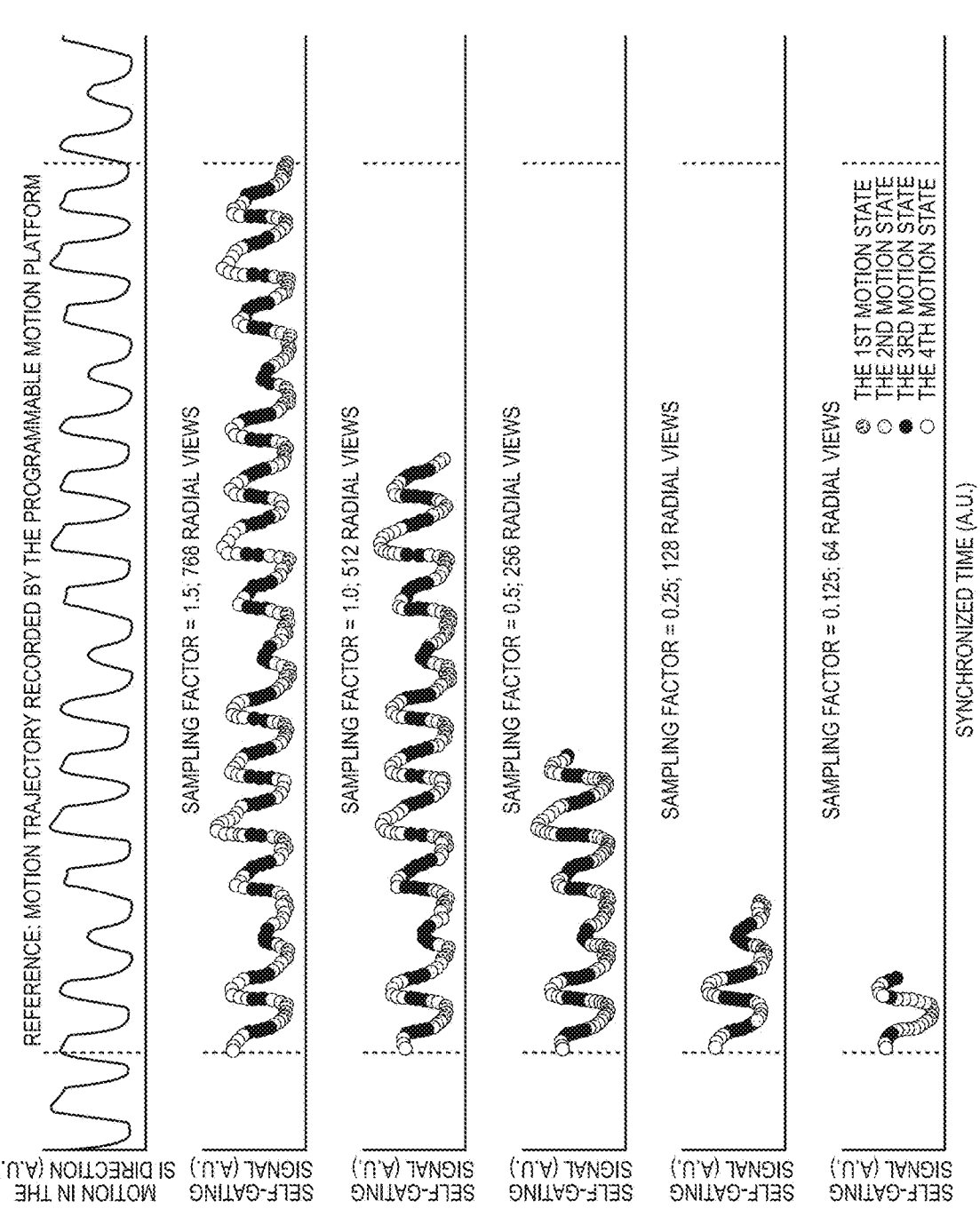
FIG. 7 shows an example respiratory motion waveform and self-gating signal curves extracted from radial data of a phantom with different radial sampling factors.

FIG. 7 shows a recorded respiratory motion waveform compared with self-gating signal curves extracted from radial readout data of the phantom data described above with different radial view sampling factors. The points on the self-gating signal curves are different motion states of the self-gating curves. In at least one example embodiment, the data with a sampling factor of 1.5 was originally acquired and the data with sampling factors of 1.0, 0.25, and 0.125 was acquired from the 1.5 sampling factor data. In at least one example embodiment, axes of synchronized time, motion in the superior-inferior (SI) direction and self-gating signal are shown in arbitrary units (A.U.) after synchronizing and scaling all plots between the two vertical dashed lines for better visualization and comparison.

Figure 8:
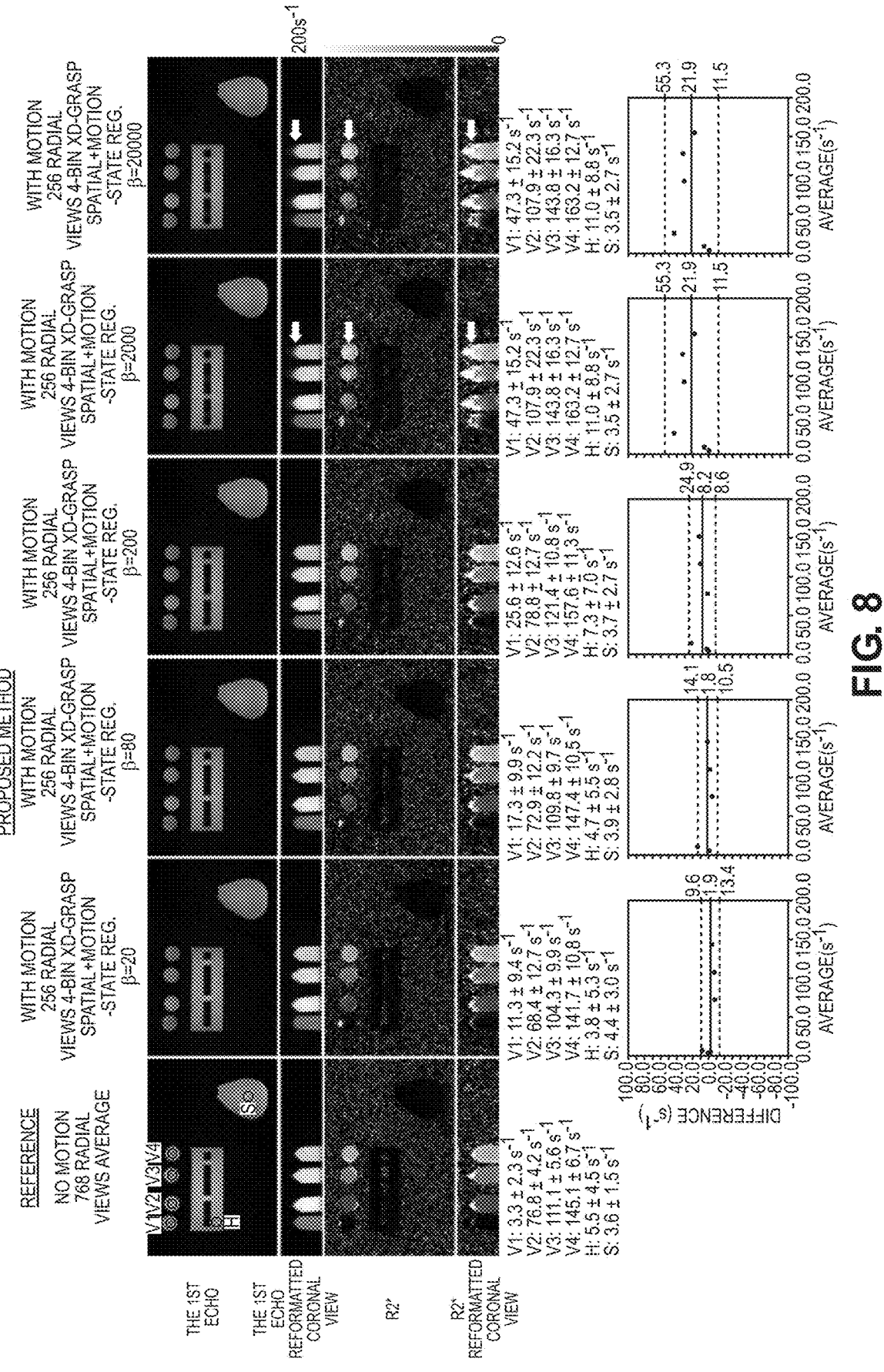
FIG. 8 shows example images and quantitative parameter maps of the phantom reconstructed with 256 radial views according to an example embodiment.

FIG. 8 shows example echo images and $R_2$* maps reconstructed using the phantom data with 256 radial views (sampling factor=0.5) and 4-bin XD-GRASP with different motion-state regularization parameter R values. The reference results are from the data with 768 radial views acquired when the phantom was not moving. The reference results are shown in the 1st (leftmost) column. All the other methods show results at the first motion state from the data acquired when the phantom was moving. These results are show in the remainder of the columns of FIG. 8. The Bland-Altman plots show comparison between the corresponding method and the reference for the $R_2$* values in the ROIs. The ROIs are identified by circles on the first echo of the reference (leftmost) column. Arrows indicate the motion-induced artifacts in the images and maps. The window/level settings are the same for all echo images and $R_2$* maps respectively. The $R_2$* values within the 6 ROIs are reported as mean±SD. As shown in FIG. 8, different quality of the reconstructed images and maps was observed with different p values, especially the motion artifacts were evident near the vial tips if $\beta$ was set too high. As stated above, these motion artifacts are shown by the arrows in columns five and six.

Figure 9:
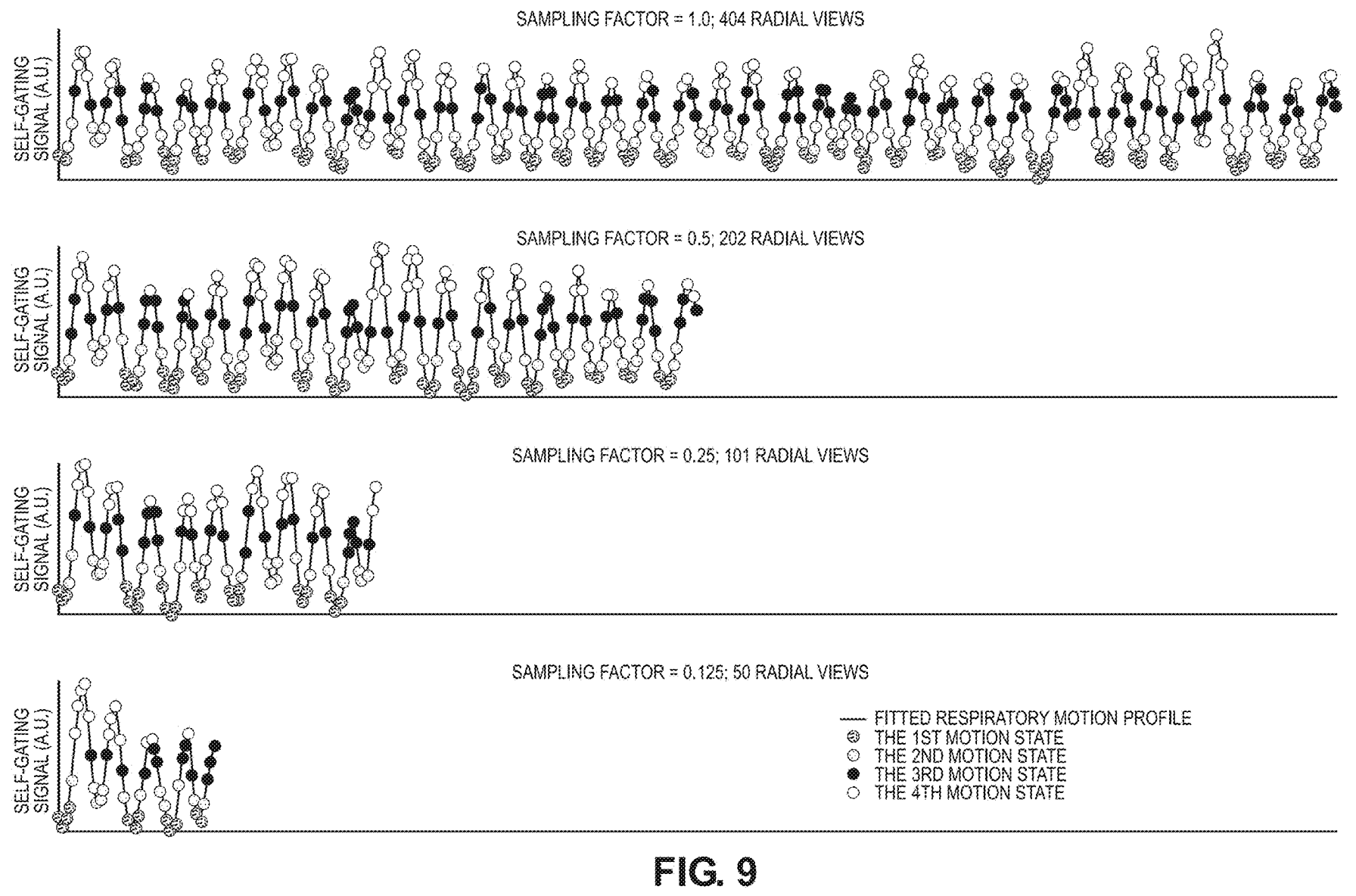

FIG. 9 shows self-gating signal curves extracted from the free-breathing radial data of one healthy subject with different radial view sampling factors, where the markers and lines denote the points and the fitted curves of the self-gating signal. The data with the sampling factor of 1.0 (404 radial views) was originally acquired, from which the other data with different sampling factors were generated retrospectively. An example of 4 respiratory motion states is shown in markers along the self-gating curves. Axes of time and self-gating signal are shown in arbitrary units (A.U.).

Figure 10:
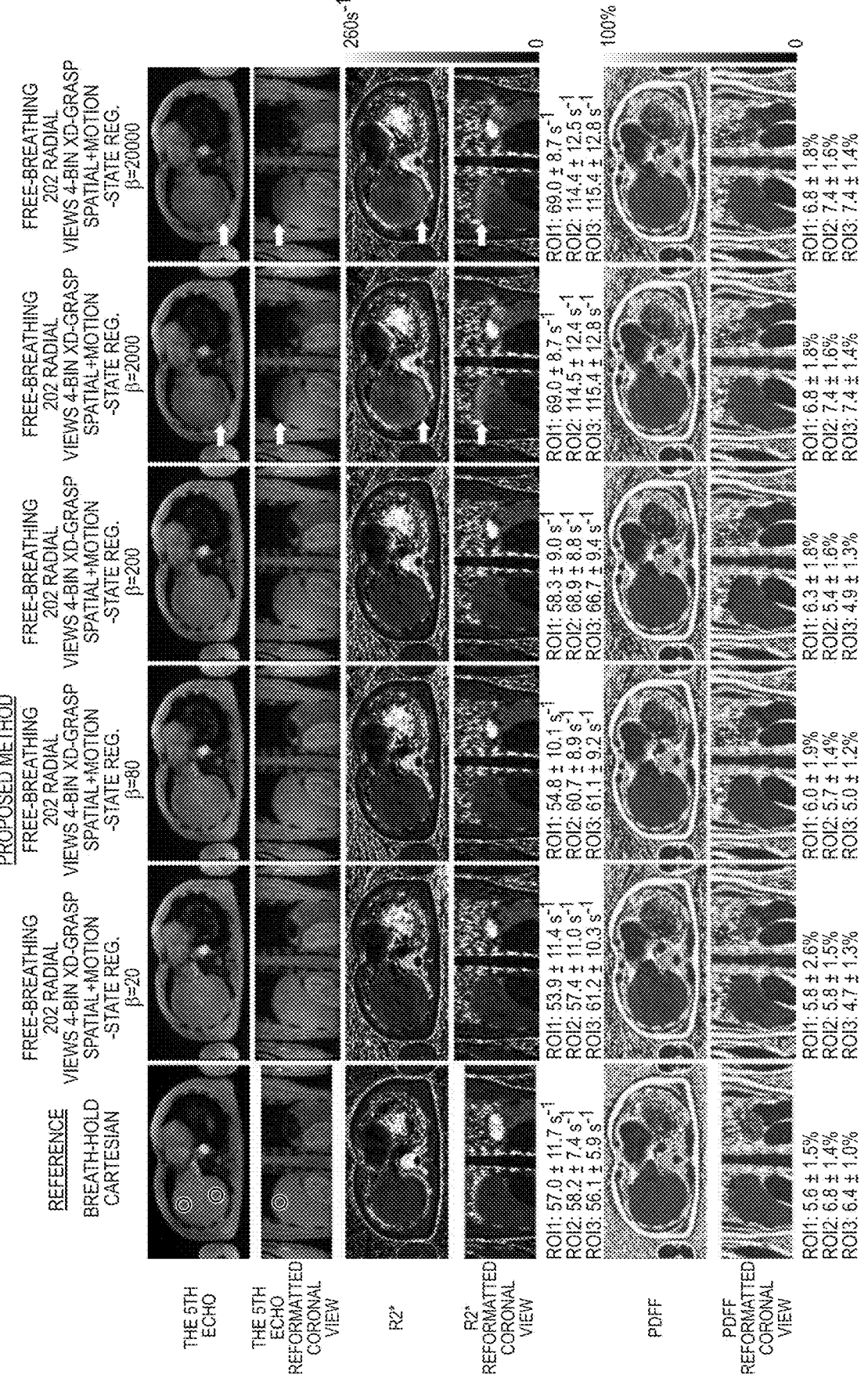
FIG. 10 shows example images and quantitative parameter maps of a subject reconstructed with 202 radial views according to an example embodiment.

FIG. 10 shows example echo images, $R_2$* and PDFF maps reconstructed using data with 202 views (sampling factor=0.5) of the same healthy subject of FIG. 9 and 4-bin XD-GRASP with different motion-state regularization parameter β values. The reference results are from the breath-hold Cartesian acquisitions as shown in the $1^{st}$ (left-most) column. All the other methods show results at the first motion state, also described herein as the end expiration state, from the data with free-breathing acquisitions. This data is shown in the remainder of the columns. The arrows indicate the motion-induced artifacts in the images and maps. The window/level settings are the same for all echo images, $R_2^*$ and PDFF maps respectively. The images and maps are cropped to focus on the liver for better visualization. The $R_2^*$ and PDFF values within three ROIs are reported as mean±SD. The ROIs are identified by circles on the fifth echo and the fifth echo reformatted coronal view of the reference (leftmost) column.

Using the in vivo data at the end expiration state, the linear mixed-effects model analysis for determining the optimal parameters revealed that for $R_2^*$ mean values, β≥2000 introduced significant bias compared to β≤200 (P<0.007), and there were no other significant differences between β values (P>0.072). There were no significant differences between all p values for PDFF mean values (P>0.946). For $R_2^*$ and PDFF SD values, β=20 had significantly more residual motion artifact compared to β≥80 (P<0.001 for both $R_2^*$ and PDFF SD), and there were no other significant differences between β values (P>0.627 for $R_2^*$ SD and P>0.758 for PDFF SD). There were no significant differences between 4-bin and 8-bin methods for $R_2^*$ mean (P>0.976), $R_2^*$ SD (P>0.422), PDFF mean (P>0.725) and PDFF SD (P>0.626) at the end expiration state.

Given the above observations and analyses, the recommended value for the motion-state regularization parameter R was 80 and the recommended value for the number of bins was 4. Results of the XD-GRASP method with this reconstruction parameter setting were selected and compared to the other methods as described further herein.

Figure 11:
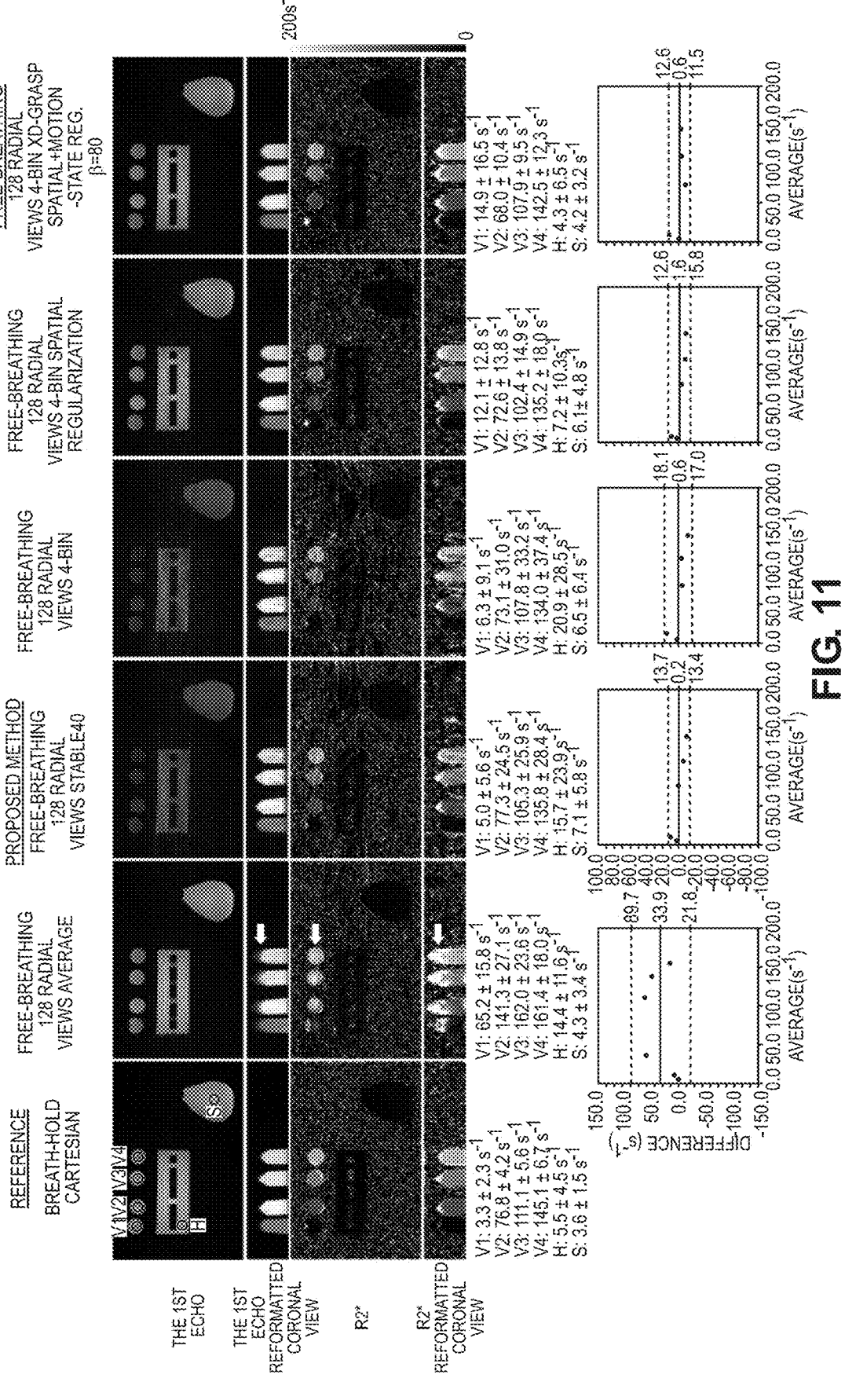
FIG. 11 shows example images and quantitative parameter maps of the phantom reconstructed with 128 radial views according to an example embodiment.

FIG. 11 shows example echo images, $R_2^*$ maps and Bland-Altman plots of the phantom using data with 128 radial views (sampling factor=0.25) and different reconstruction methods. Improved quality of echo images and $R_2^*$ maps was evident by the XD-GRASP method compared to the stable40 method. MD and LoA for the XD-GRASP method were [−0.6; −13.7, 12.6] $s^{-1}$ for $R_2^*$, similar to those of the stable40 method: [0.2; −13.4, 13.7] $s^{-1}$.

Linear mixed-effects model fitting results for the unpaired tests on the CV values of pixel intensities within the ROIs on the first echo image and the paired tests on $R_2^*$ mean and SD values between different methods and the reference measurements without motion are stated in Supporting Information. In addition, linear model plots of the effects of the method and the sampling factor for these tests are shown in FIG. 11. Briefly, among all sampling factors, 4-bin XD-GRASP had the smallest CV, corresponding to the best image quality. The average method produced biased $R_2^*$ values that were at least 17.8 $s^{-1}$ greater than the reference results without motion, which was significant (P=0.013), while all other methods showed no significant differences compared with the reference results (P>0.131). For the sampling factor of 0.125, all methods had significantly increased SD values compared to the reference results without motion, e.g., significant residual undersampling or motion artifacts on the $R_2^*$ maps (P<0.033), while for the sampling factors of 1.0, 0.5, and 0.25, different methods had varied residual artifacts with the XD-GRASP method consistently having insignificant residual artifacts (P>0.281).

Figure 12:
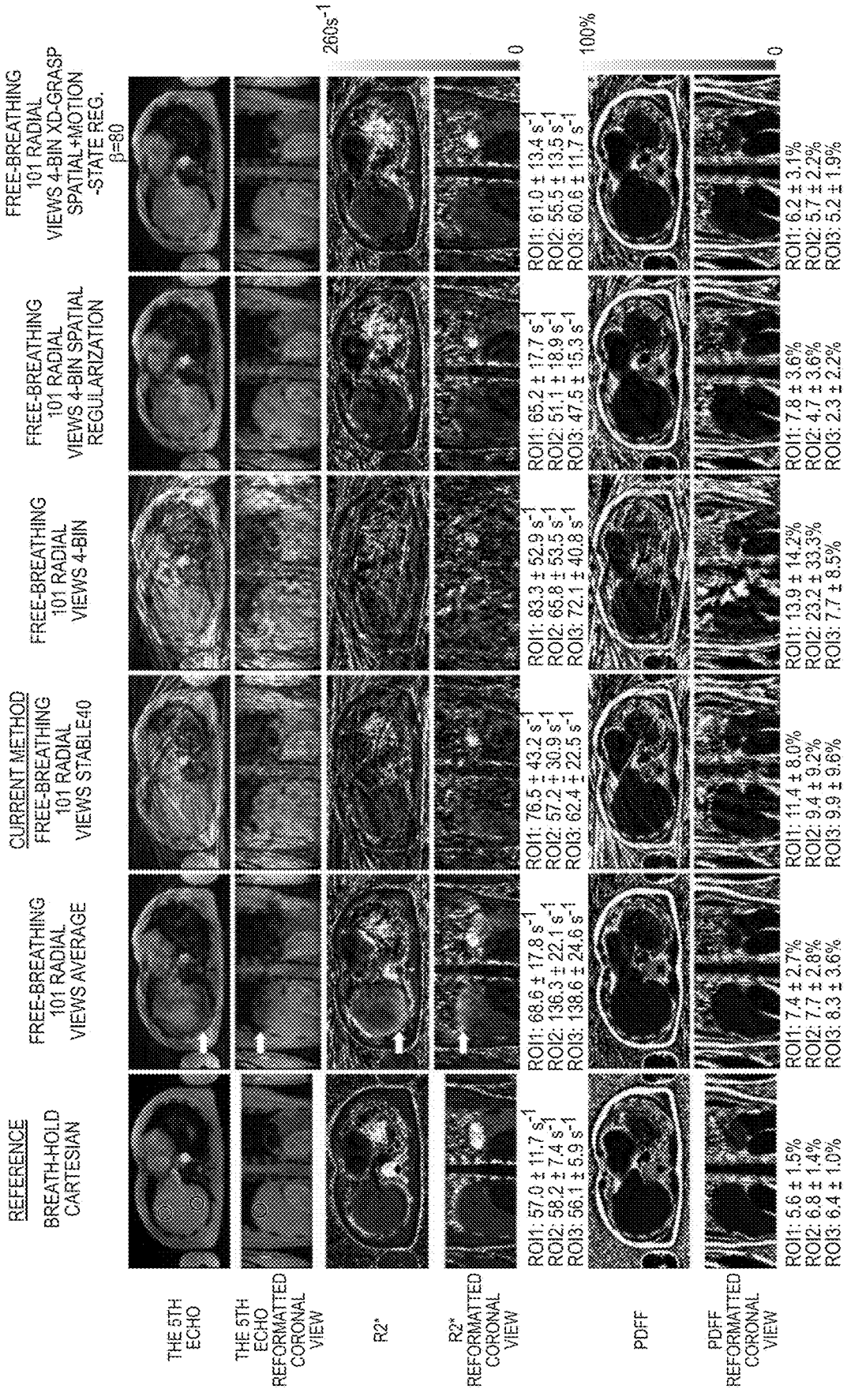
FIG. 12 shows example images and quantitative parameter maps of a subject reconstructed with 101 radial views according to an example embodiment.

FIG. 12 shows example echo images, $R_2^*$ and PDFF maps of the same healthy subject as shown in FIGS. 9 and 10 using data with 101 radial views (sampling factor=0.25).

The reference results are from the breath-hold Cartesian acquisitions and are shown in the first (leftmost) column. All the other methods show results at the first motion state from the data with free-breathing acquisitions. Arrows indicate the motion-induced artifacts in the images and maps. The window/level settings are the same for all echo images, $R_2^*$ and PDFF maps respectively. The echo images of stable40 and 4-bin as shown in the 3rd and 4th columns of the first two rows have different image scaling of the reconstruction pipeline from the other echo images. The images and maps are cropped for better visualization. The $R_2^*$ and PDFF values within three ROIs are reported as mean±SD. The ROIs are identified by circles on the fifth echo and the fifth echo reformatted coronal view of the reference (leftmost) column.

Figure 13:
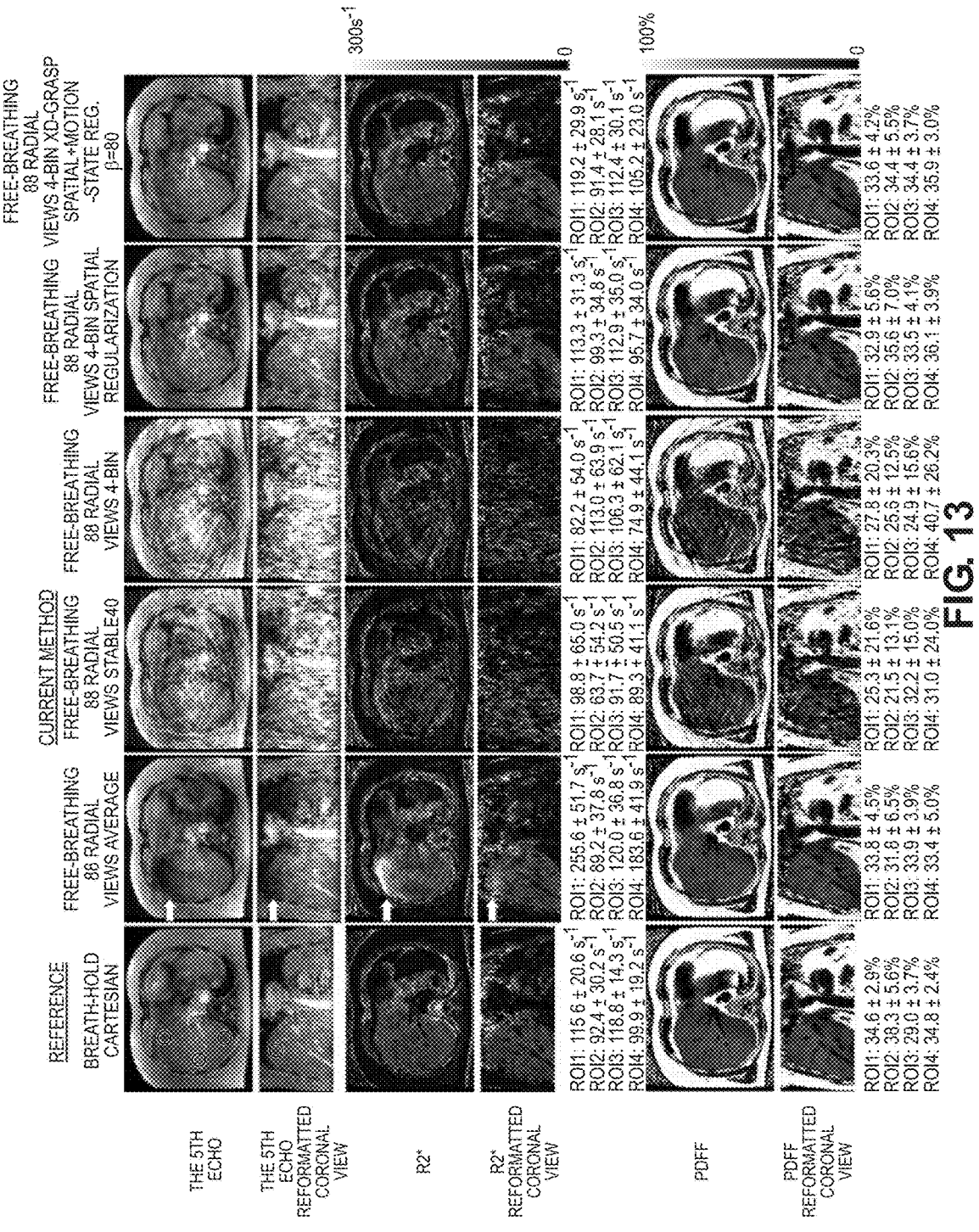
FIG. 13 shows example images and quantitative parameter maps of a subject reconstructed with 88 radial views according to an example embodiment.

FIG. 13 shows example echo images, $R_2^*$ and PDFF maps of a clinical subject using data with 88 radial views (sampling factor=0.25). The reference results are from the breath-hold Cartesian acquisitions as shown in the 1st (leftmost) column. All the other methods show results at the first motion state from the data with free-breathing acquisitions. Arrows indicate the motion-induced artifacts in the images and maps. The window/level settings are the same for all echo images, $R_2^*$ and PDFF maps respectively. The echo images of stable40 and 4-bin as shown in the 3rd and 4th columns of the first two rows have different image scaling of the reconstruction pipeline from the other echo images. The images and maps are cropped for better visualization. The $R_2^*$ and PDFF values within four ROIs are reported as mean±SD. The ROIs are identified by circles on the fifth echo and the fifth echo reformatted coronal view of the reference (leftmost) column.

Figure 14:
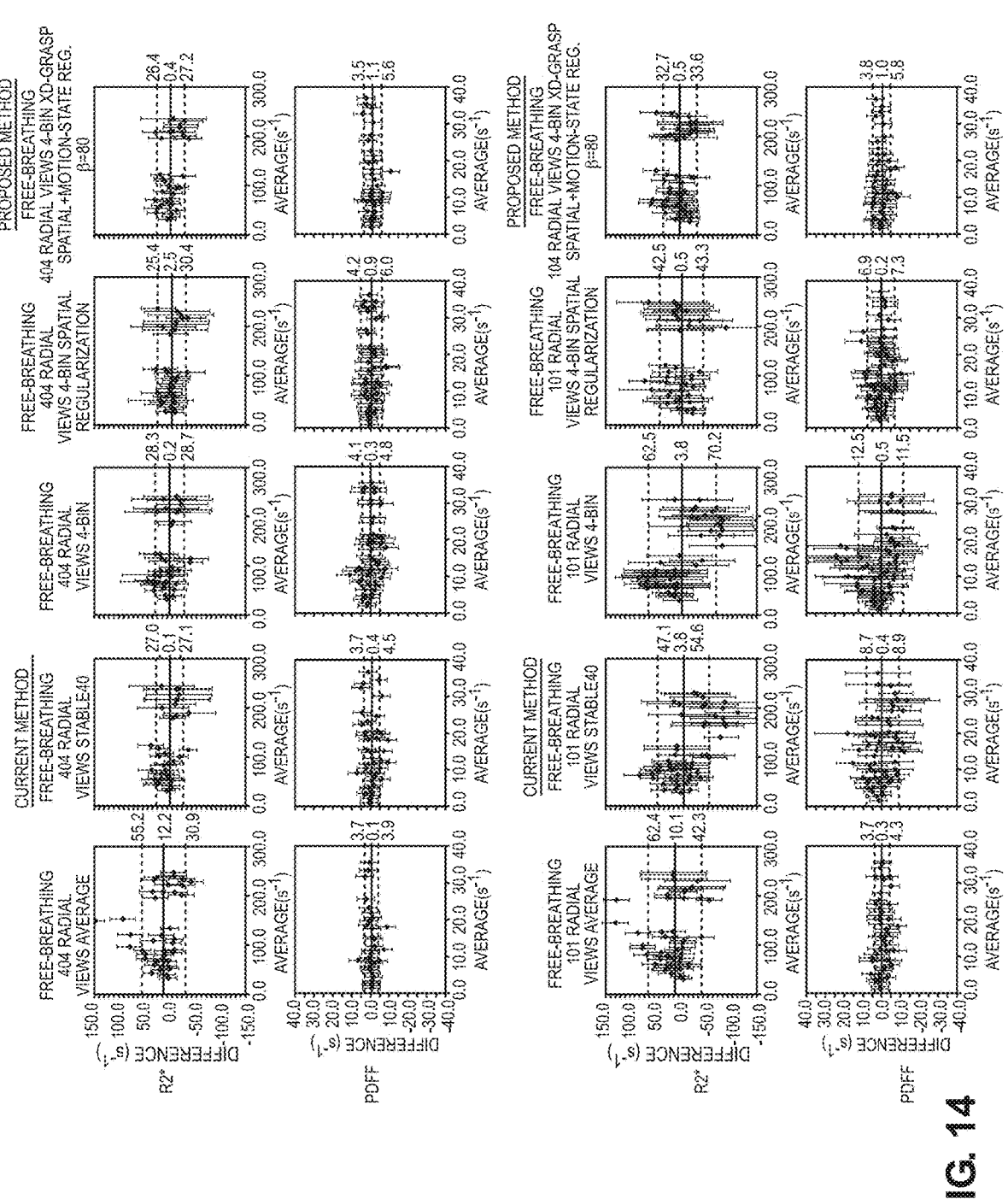
FIG. 14 shows Bland-Altman plots comparing quantitative parameters according to example embodiments.

FIG. 14 shows example Bland-Altman plots comparing the $R_2^*$ and PDFF results from different methods vs. those from the reference breath-hold Cartesian acquisitions for data with 404 (a) and 101 radial views (b), respectively. The difference was obtained by results from free-breathing stack-of-radial acquisitions minus results from the reference breath-hold Cartesian acquisitions. Different colors represent the values within 12 ROIs of different subjects. The error bars are the standard deviation of measured $R_2^*$ or PDFF values within the ROI of each method.

The MD and LoA for the stable40 method using 101 radial views were [−3.8; −54.6, 47.1]$s^{-1}$ for $R_2^*$ and [−0.4; −8.9, 8.2]% for PDFF. MD and LoA for the XD-GRASP method using 101 radial views were [−0.5; −33.6, 32.7]$s^{-1}$ for $R_2^*$ and [−1.0; −5.8, 3.8]% for PDFF, closer to those of the stable40 method using 404 radial views: [−0.1; −27.1, 27.0] $s^{-1}$ for $R_2^*$ and [−0.4; −4.5, 3.7]% for PDFF. Similar performance was also observed for the error bars.

Linear mixed-effects model fitting results for the unpaired tests on the CV values of pixel intensities on the first echo image and the paired tests on mean and SD values of $R_2^*$ and PDFF between different methods and the reference breath-hold Cartesian method are stated in Supporting Information. The 4-bin XD-GRASP either had the best (lowest) CV or was not significantly different from other methods, and especially had significantly lower CV than all other methods for sampling factors of 0.125 and 0.25 (P<0.001), reflecting better image quality. For $R_2^*$ mean values, only the average method showed significant biases for all sampling factors except 0.125 (P<0.027), and no other methods introduced any significant biases (P>0.154). For $R_2^*$ SD values, except for the XD-GRASP method and the average method, all other methods showed significantly higher SD values (i.e., more residual artifacts on $R_2^*$ maps) than the reference breath-hold method for all sampling factors (P<0.021). For PDFF mean values, the 4-bin XD-GRASP method had a small amount of negative bias for sampling factors of 0.5 and 1.0, but was not significantly different from that of any other method. For PDFF SD values, for sampling factors of 0.25 and greater, the XD-GRASP and average methods were not significantly different from each other (P>0.812), but together were significantly lower than all other methods (P<0.002).

The XD-GRASP method, according to one or more example embodiments described herein, may provide improved acquisition time and reconstruction time. Total times of all original acquisitions, as well as the equivalent acquisition times of the proposed method with different sampling factors, are shown in FIG. 6. For phantom experiments, a sampling factor of 0.25 was the empirically preferred acceleration factor, leading to an equivalent total acquisition time of 55 seconds compared to the equivalent acquisition time of 2 minutes and 36 seconds corresponding to the fully sampled baseline protocol. For in vivo experiments, the sampling factor of 0.25 was also preferred and led to an equivalent total acquisition time of 1 minute and 4 seconds or 59 seconds, compared to the baseline acquisition time of 2 minutes and 51 seconds or 2 minutes and 33 seconds.

The proposed XD-GRASP method was implemented and tested on a desktop computer with an 8-Core i7-6700 CPU at 3.4 GHz, 64 GB RAM and a Quadro P2200 graphics card with 5 GB memory, which took 5 minutes and 5 seconds to generate results for the in vivo free-breathing stack-of-radial imaging protocol with 101 radial views. The CPU-only reconstruction required 8 minutes and 13 seconds for the same dataset on a vendor-specific simulator computer (16-Core CPU at 3.0 GHz, 128 GB RAM, no GPU). With a 24-Core CPU at 2.5 GHz, 256 GB RAM and two GPUs each with 8 GB GPU memory on the image reconstruction system of a 3T scanner, the inline reconstruction time of the acquisition with the same protocol was 4 minutes and 8 seconds.

Embodiments of the XD-GRASP method described herein may provide flexibility for use in research and/or clinical settings. The XD-GRASP method may provide agreement of PDFF and $R_2^*$ as compared to the reference results in a motion phantom and in vivo. This XD-GRASP method may additionally provide equivalent or less PDFF and $R_2^*$ quantification bias and variations, and/or improved image quality as compared to a self-gating method. An accelerated in vivo imaging protocol with a radial view sampling factor of 0.25 and the proposed reconstruction method were validated, which achieved an acceleration factor of 4 and an approximate acquisition time saving of 107 seconds (62.6% shorter) or 94 seconds (61.4% shorter). This proposed method may allow accelerated free-breathing liver PDFF and $R_2^*$ mapping.

The following is a list of non-limiting illustrative embodiments disclosed herein:

Illustrative embodiment 1. A method of generating at least one image using a magnetic resonance imaging (MRI) system comprises: generating, for each contrast of a plurality of contrasts, an image by forming a multi-dimensional data matrix by dividing MRI imaging data for a contrast into a plurality of bins, each bin of the plurality of bins corresponding to one of a plurality of respiratory motion states and generating the image based on at least the MRI imaging data and the multi-dimensional data matrix.

Illustrative embodiment 2. The method of illustrative embodiment 1 further comprising: generating a transformation matrix for each contrast of the plurality of contrasts, wherein the generating generates an image based on the MRI imaging data, the multi-dimensional data matrix and the transformation matrix.

Illustrative embodiment 3. The method of illustrative embodiment 2, wherein the transformation matrix includes at least one of an undersampling pattern, a coil sensitivity map, or a non-uniform Fourier transform.

Illustrative embodiment 4. The method of illustrative embodiment 2 or 3, further comprising determining an image regularization involving a linear transformation for each contrast of the plurality of contrasts, wherein the generating generates an image based on the MRI imaging data, the multi-dimensional data matrix, the transformation matrix, and the image regularization.

Illustrative embodiment 5. The method of illustrative embodiment 4, wherein the image regularization includes at least one regularization factor.

Illustrative embodiment 6. The method of illustrative embodiment 5, wherein the at least one image regularization factor is at least one of a regularization factor for spatial regularization or motion-state regularization.

Illustrative embodiment 7. The method of illustrative embodiment 2, 3, 4, 5, or 6, further comprising, for each contrast of the plurality of contrasts: applying the transformation matrix to the multi-dimensional data matrix for the contrast to obtain a transformed multi-dimensional data matrix, wherein the generating generates the image based on the MRI imaging data and the transformed multi-dimensional data matrix.

Illustrative embodiment 8. The method of one of embodiments 1 to 7, wherein the generating generates the image based on the MRI imaging data, the multi-dimensional data matrix, a transformation matrix, and an image regularization.

Illustrative embodiment 9. The method of illustrative embodiment 8, wherein the generating the image comprises: evaluating an optimization function based on the MRI imaging data, the multi-dimensional data matrix, the transformation matrix, and the image regularization.

Illustrative embodiment 10. The method of illustrative embodiment 9, wherein the optimization function is based on an optimization equation given by $$\frac{1}{2}\|Ax - y\|_2^2 + \|W(\alpha, \beta)x\|_1$$

where A is the transformation matrix, x is a multi-dimensional data matrix of the imaging data to be reconstructed, the multi-dimensional data matrix including at least a spatial dimension and a motion-state dimension, y is the multi-dimensional data matrix of acquired k-space data assigned to k-space and motion state dimensions, and W is the image regularization.

Illustrative embodiment 11. The method of one of embodiments 1 to 10, further comprising: acquiring the MRI imaging data from an MRI system, wherein the MRI imaging data is acquired for each contrast of the plurality of contrasts resulting from application of a pulse of the MRI system.

Illustrative embodiment 12. The method of illustrative embodiment 11, further comprising: extracting a self-gating signal from the MRI imaging data, and determining, based on the self-gating signal, the plurality of respiratory motion states associated with acquisition of the MRI imaging data, wherein a separate self-gating signal is extracted for each contrast included in the plurality of contrasts.

Illustrative embodiment 13. The method of one of embodiments 11 or 12, wherein the MRI imaging data is acquired using a stack-of star trajectory and a self-gating signal is extracted from the MRI imaging data by sampling a plurality of radial views included in the MRI imaging data.

Illustrative embodiment 14. The method of one of embodiments 11, 12, or 13, further comprising: determining the plurality of motion states associated with acquisition of the MRI imaging data by measuring one or more physiological signals with the MRI system.

Illustrative embodiment 15. The method of one of embodiments 1 to 14, further comprising: calculating one or more biomarker parameter maps based on the images generated for the plurality of contrasts.

Illustrative embodiment 16. The method of illustrative embodiment 15, wherein the one or more biomarker parameter maps includes at least one of a proton density fat fraction (PDFF) parameter map or a transverse relaxation rate $(R_2^*)$ parameter map.

Illustrative embodiment 17. A system for generating at least one image, the system comprising: at least one processor, and at least one memory including instructions that when executed by the at least one processor, cause the system to generate, for each contrast of a plurality of contrasts, an image by forming a multi-dimensional data matrix by dividing MRI imaging data for a contrast into a plurality of bins, each bin of the plurality of bins corresponding to one of a plurality of respiratory motion states, and generating the image based on at least the MRI imaging data and the multi-dimensional data matrix.

Illustrative embodiment 18. The system of illustrative embodiment 17, wherein the system is further caused to calculate one or more biomarker parameter maps based on the images generated for the plurality of contrasts.

Illustrative embodiment 19. A non-transitory computer readable medium system storing computer readable instruction that, when executed by one or more processors of a system, cause the system to perform a method of generating at least one image, the method comprising: generating, for each contrast of a plurality of contrasts, an image by forming a multi-dimensional data matrix by dividing MRI imaging data for a contrast into a plurality of bins, each bin of the plurality of bins corresponding to one of a plurality of respiratory motion states, and generating the image based on at least the MRI imaging data and the multi-dimensional data matrix.

Illustrative embodiment 20. The system of illustrative embodiment 19, wherein the method further comprises: calculating one or more biomarker parameter maps based on the images generated for the plurality of contrasts.

Although the present invention has been described in detail with reference to example embodiments, the present invention is not limited by the disclosed examples from which the skilled person is able to derive other variations without departing from the scope of the invention.

None of the elements recited in the claims are intended to be a means-plus-function element within the meaning of 35 U.S.C. § 112(f) unless an element is expressly recited using the phrase "means for" or, in the case of a method claim, using the phrases "operation for" or "step for."

The terminology used herein is for the purpose of describing particular embodiments only and is not intended to be limiting of example embodiments. As used herein, the singular forms "a," "an," and "the," are intended to include the plural forms as well, unless the context clearly indicates otherwise. As used herein, the terms "and/or" and "at least one of" include any and all combinations of one or more of the associated listed items. It will be further understood that the terms "comprises," "comprising," "includes," and/or "including," when used herein, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Expressions such as "at least one of," when preceding a list of elements, modify the entire list of elements and do not modify the individual elements of the list.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Specific structural and functional details disclosed herein are merely representative for purposes of describing example embodiments. This invention may, however, be embodied in many alternate forms and should not be construed as limited to only the embodiments set forth herein.

Units and/or devices according to one or more example embodiments may be implemented using hardware, software, and/or a combination thereof. For example, hardware devices may be implemented using processing circuitry such as, but not limited to, a processor, at least one central processing unit (CPU), a controller, an arithmetic logic unit (ALU), a digital signal processor, a microcomputer, a field programmable gate array (FPGA), a System-on-Chip (SoC), a programmable logic unit, a microprocessor, or any other device capable of responding to and executing instructions in a defined manner. Portions of the example embodiments and corresponding detailed description may be presented in terms of software, or algorithms and symbolic representations of operation on data bits within a computer memory. These descriptions and representations are the ones by which those of ordinary skill in the art effectively convey the substance of their work to others of ordinary skill in the art. An algorithm, as the term is used here, and as it is used generally, is conceived to be a self-consistent sequence of steps leading to a desired result. The steps are those requiring physical manipulations of physical quantities. Usually, though not necessarily, these quantities take the form of optical, electrical, or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

For example, when a hardware device is a computer processing device (e.g., a processor, Central At least one processor (CPU), a controller, an arithmetic logic unit (ALU), a digital signal processor, a microcomputer, a microprocessor, etc.), the computer processing device may be configured to carry out program code by performing arithmetical, logical, and input/output operations, according to the program code. Once the program code is loaded into a computer processing device, the computer processing device may be programmed to perform the program code, thereby transforming the computer processing device into a special-purpose computer processing device. In a more specific example, when the program code is loaded into a processor, the processor becomes programmed to perform the program code and operations corresponding thereto, thereby transforming the processor into a special-purpose processor. According to one or more example embodiments, at least one memory may include or store computer program code, and the at least one memory and the computer program code may be configured to, with at least one processor, cause an information processing device and/or an acquisition device to perform the necessary tasks. Additionally, the processor, memory and example algorithms, encoded as computer program code, serve as means for providing or causing performance of operations discussed herein.

It should be borne in mind, however, that all of these and similar terms are to be associated with the appropriate physical quantities and are merely convenient labels applied to these quantities. Unless specifically stated otherwise, or as is apparent from the discussion, terms such as "processing" or "computing" or "calculating" or "determining" of "displaying" or the like, refer to the action and processes of a computer system, or similar electronic computing device/ hardware, that manipulates and transforms data represented as physical, electronic quantities within the computer system's registers and memories into other data similarly represented as physical quantities within the computer system memories or registers or other such information storage, transmission or display devices.

Software may include a computer program, program code, instructions, or some combination thereof, for independently or collectively instructing or configuring a hardware device to operate as desired. The computer program and/or program code may include program or computer-readable instructions, software components, software modules, data files, data structures, and/or the like, capable of being implemented by one or more hardware devices, such as one or more of the hardware devices mentioned above. Examples of program code include both machine code produced by a compiler and higher-level program code that is executed using an interpreter.

Software and/or data may be embodied permanently or temporarily in any type of machine, component, physical or virtual equipment, or computer storage medium or device, capable of providing instructions or data to, or being interpreted by, a hardware device. The software also may be distributed over network coupled computer systems so that the software is stored and executed in a distributed fashion. In particular, for example, software and data may be stored by one or more computer-readable recording mediums, including the tangible or non-transitory computer-readable storage media discussed herein.

Even further, any of the disclosed methods may be embodied in the form of a program or software. The program or software may be stored on a non-transitory computer-readable medium and is adapted to perform any one of the aforementioned methods when run on a computer device (a device including a processor). Thus, the non-transitory, tangible computer-readable medium, is adapted to store information and is adapted to interact with a data processing facility or computer device to execute the program of any of the above mentioned embodiments and/or to perform the method of any of the above-mentioned embodiments.

Example embodiments being thus described, it will be obvious that the same may be varied in many ways. Such variations are not to be regarded as a departure from the spirit and scope of the present invention, and all such modifications as would be obvious to one skilled in the art are intended to be included within the scope of the following claims.

What is claimed is:

1. A method of generating at least one image using a magnetic resonance imaging (MRI) system, the method comprising:

generating, for each contrast of a plurality of contrasts, an image by forming a first multi-dimensional data matrix by dividing MRI imaging data for a contrast into a plurality of bins, each bin of the plurality of bins corresponding to one of a plurality of respiratory motion states and the first multi-dimensional data matrix including acquired k-space data assigned to k-space and motion state dimensions, and generating the image by evaluating an optimization function based on the MRI imaging data, the first multi-dimensional data matrix, a transformation matrix, and an image regularization.

2. The method of claim 1, further comprising:

generating the transformation matrix for each contrast of the plurality of contrasts.

3. The method of claim 2, wherein the transformation matrix includes at least one of an undersampling pattern, a coil sensitivity map, or a non-uniform Fourier transform.

4. The method of claim 2, further comprising:

determining the image regularization involving a linear transformation for each contrast of the plurality of contrasts.

5. The method of claim 4, wherein the image regularization includes at least one regularization factor.

6. The method of claim 5, wherein the at least one regularization factor is at least one of a regularization factor for spatial regularization or motion-state regularization.

7. The method of claim 2, further comprising, for each contrast of the plurality of contrasts:

applying the transformation matrix to the first multi-dimensional data matrix for the contrast to obtain a transformed multi-dimensional data matrix;

wherein the generating generates the image based on the MRI imaging data and the transformed multi-dimensional data matrix.

8. The method of claim 1, wherein the optimization function is based on an optimization equation given by $$\frac{1}{2}\|Ax - y\|_2^2 + \|W(\alpha, \beta)x\|_1,$$

wherein

A is the transformation matrix, x is a second multi-dimensional data matrix of the MRI imaging data to be reconstructed, the second multi-dimensional data matrix including at least a spatial dimension and a motion-state dimension, y is the first multi-dimensional data matrix of the acquired k-space data assigned to k-space and motion-state dimensions, and W is the image regularization.

9. The method of claim 1, further comprising:

acquiring the MRI imaging data from an MRI system, wherein the MRI imaging data is acquired for each contrast of the plurality of contrasts resulting from application of a pulse of the MRI system.

10. The method of claim 9, further comprising:

extracting a self-gating signal from the MRI imaging data; and determining, based on the self-gating signal, the plurality of respiratory motion states associated with acquisition of the MRI imaging data, wherein a separate self-gating signal is extracted for each contrast included in the plurality of contrasts.

11. The method of claim 9, wherein the MRI imaging data is acquired using a stack-of-star trajectory and a self-gating signal is extracted from the MRI imaging data by sampling a plurality of radial views included in the MRI imaging data.

12. The method of claim 9, further comprising:

determining the plurality of respiratory motion states associated with acquisition of the MRI imaging data by measuring one or more physiological signals with the MRI system.

13. The method of claim 1, further comprising:

calculating one or more biomarker parameter maps based on the images generated for the plurality of contrasts.

14. The method of claim 13, wherein the one or more biomarker parameter maps comprise at least one of a proton density fat fraction (PDFF) parameter map or a transverse relaxation rate ($R_2^*$) parameter map.

15. A system for generating at least one image, the system comprising:

at least one processor; and at least one memory including instructions that, when executed by the at least one processor, cause the system to generate, for each contrast of a plurality of contrasts, an image by forming a first multi-dimensional data matrix by dividing MRI imaging data for a contrast into a plurality of bins, each bin of the plurality of bins corresponding to one of a plurality of respiratory motion states and the first multi-dimensional data matrix including acquired k-space data assigned to k-space and motion state dimensions, and generating the image by evaluating an optimization function based on the MRI imaging data, the first multi-dimensional data matrix, a transformation matrix, and an image regularization.

16. The system of claim 15, wherein the system is further caused to:

calculate one or more biomarker parameter maps based on the images generated for the plurality of contrasts.

17. A non-transitory computer readable medium system storing computer readable instruction that, when executed by one or more processors of a system, cause the system to perform a method of generating at least one image, the method comprising:

generating, for each contrast of a plurality of contrasts, an image by forming a first multi-dimensional data matrix by dividing MRI imaging data for a contrast into a plurality of bins, each bin of the plurality of bins corresponding to one of a plurality of respiratory motion states and the first multi-dimensional data matrix including acquired k-space data assigned to k-space and motion state dimensions, and generating the image by evaluating an optimization function based on the MRI imaging data, the first multi-dimensional data matrix, a transformation matrix, and an image regularization.

18. The non-transitory computer readable medium of claim 17, wherein the method further comprises:

calculating one or more biomarker parameter maps based on the images generated for the plurality of contrasts.

* * * * *